US012672426B2

(12) United States Patent
Hanari

(10) Patent No.: US 12,672,426 B2
(45) Date of Patent: Jun. 30, 2026

(54) MANUFACTURING METHOD OF DISPLAY DEVICE AND DISPLAY DEVICE

(71) Applicant: Magnolia White Corporation, Tokyo (JP)

(72) Inventor: Jun Hanari, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 526 days.

(21) Appl. No.: 18/361,927

(22) Filed: Jul. 31, 2023

(65) Prior Publication Data

US 2024/0040817 A1 Feb. 1, 2024

(30) Foreign Application Priority Data

Aug. 1, 2022 (JP) ................................. 2022-122532

(51) Int. Cl.
  *H10K 50/18* (2023.01)
  *H10K 59/12* (2023.01)
(52) U.S. Cl.
  CPC ....... *H10K 50/181* (2023.02); *H10K 59/1201* (2023.02)
(58) Field of Classification Search
  CPC .......................... H10K 59/1201; H10K 50/181
  See application file for complete search history.

(56) References Cited

U.S. PATENT DOCUMENTS

| 6,137,220 | A | * | 10/2000 | Nagayama | ........... | H10K 59/173 |
| | | | | | | 313/506 |
| 2004/0160170 | A1 | | 8/2004 | Sato et al. | | |
| 2009/0009069 | A1 | | 1/2009 | Takata | | |
| 2019/0363275 | A1 | | 11/2019 | Ochi et al. | | |
| 2022/0077251 | A1 | | 3/2022 | Choung et al. | | |
| 2022/0320441 | A1* | | 10/2022 | Uno | ..................... | C07D 405/14 |
| 2023/0422560 | A1* | | 12/2023 | Takayama | ............ | H10K 59/122 |

FOREIGN PATENT DOCUMENTS

| JP | 2000-195677 A | 7/2000 |
| JP | 2004-207217 A | 7/2004 |
| JP | 2008-135325 A | 6/2008 |
| JP | 2009-32673 A | 2/2009 |
| JP | 2010-118191 A | 5/2010 |
| WO | 2018/179308 A1 | 10/2018 |

* cited by examiner

*Primary Examiner* — Abdulmajeed Aziz
*Assistant Examiner* — Nathaniel J Lee
(74) *Attorney, Agent, or Firm* — XSENSUS LLP

(57) ABSTRACT

According to one embodiment, a manufacturing method of a display device includes forming a lower electrode, forming an organic layer on the lower electrode, and forming an upper electrode on the organic layer. The forming the organic layer includes a process of forming a first blocking layer, a process of forming a first light emitting layer on the first blocking layer, and a process of forming a second blocking layer on the first light emitting layer. A spread angle of a material for forming the first light emitting layer is less than a spread angle of a material for forming the first blocking layer. A spread angle of a material for forming the second blocking layer is greater than the spread angle of the material for forming the first light emitting layer.

15 Claims, 20 Drawing Sheets

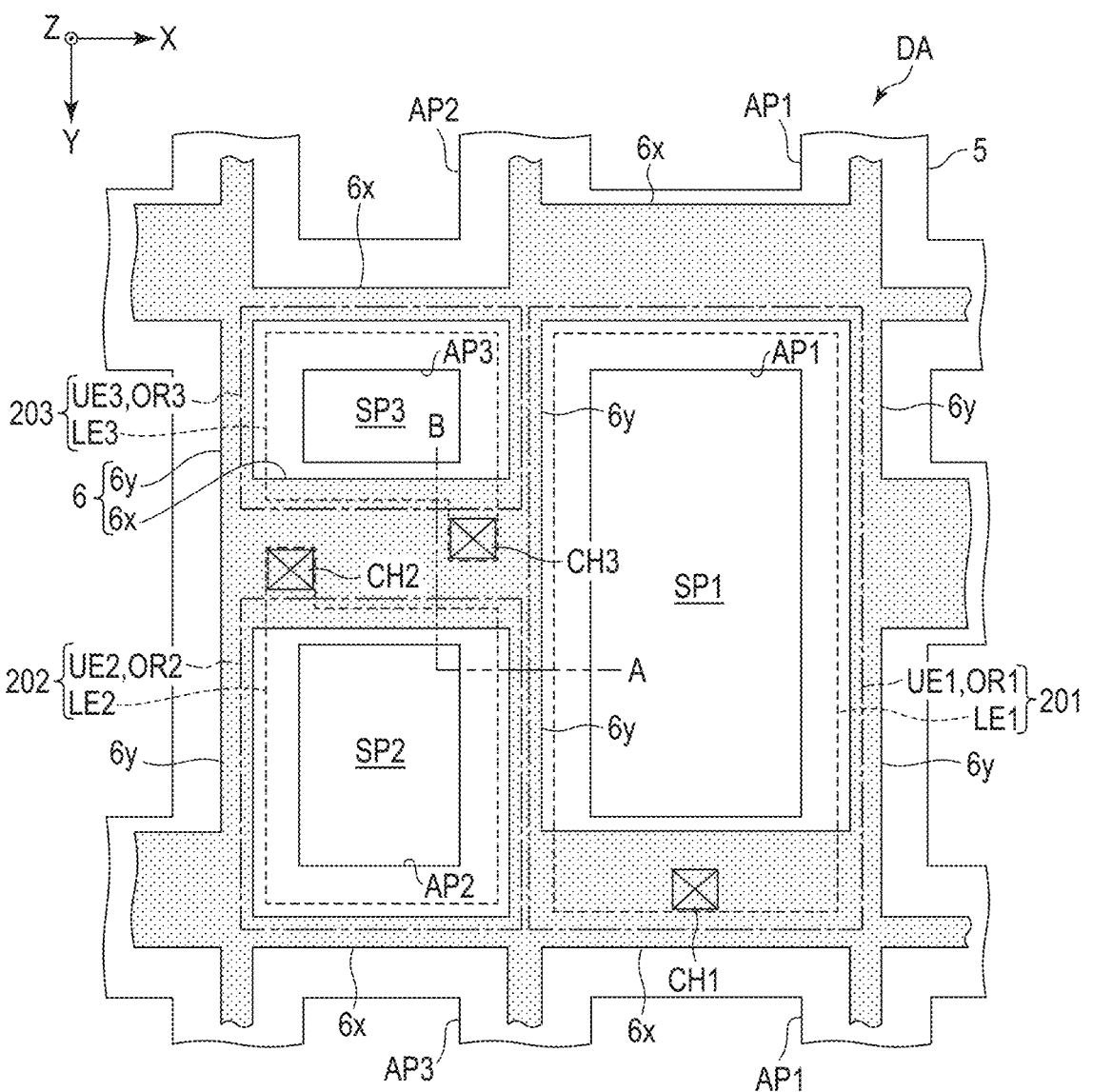
F I G. 2

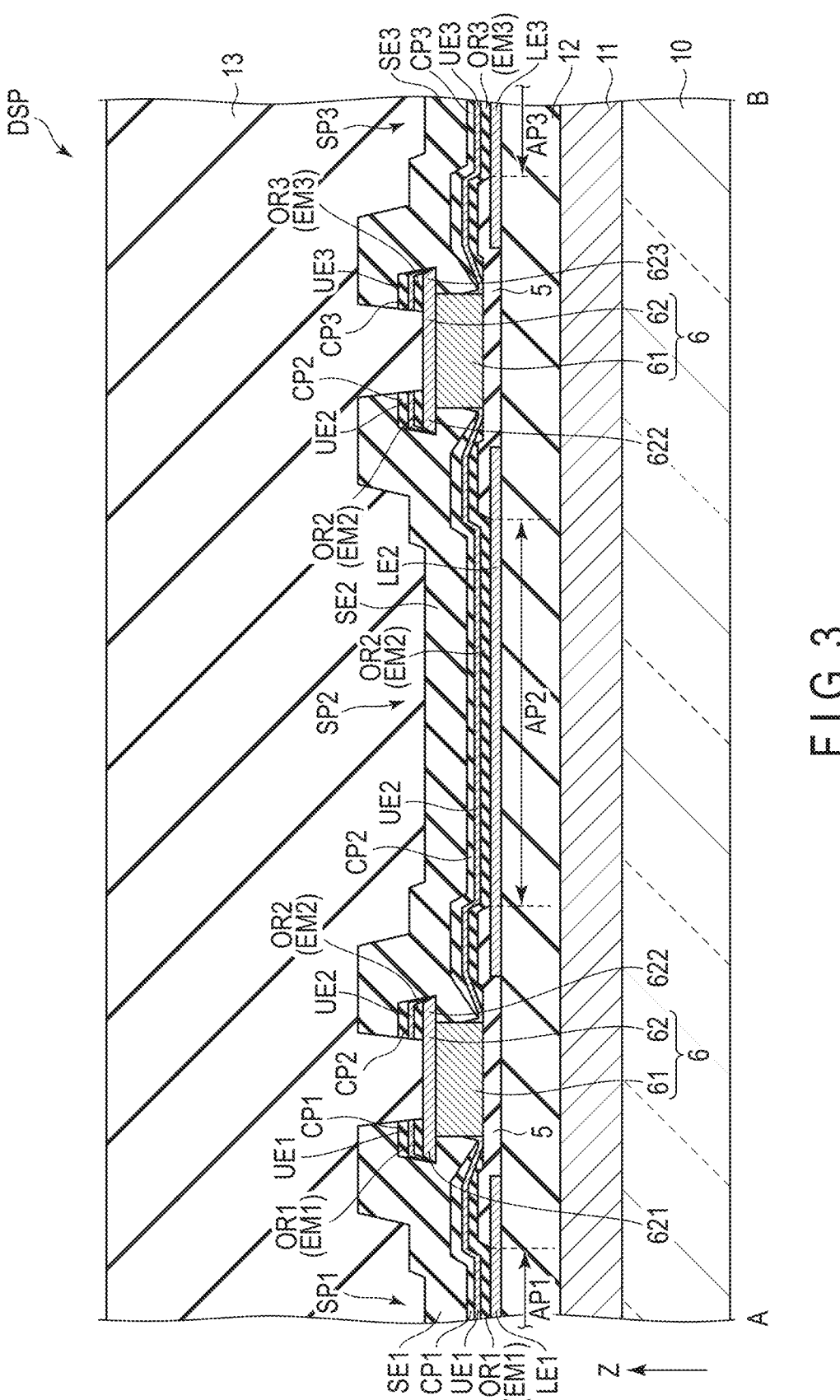
F I G. 3

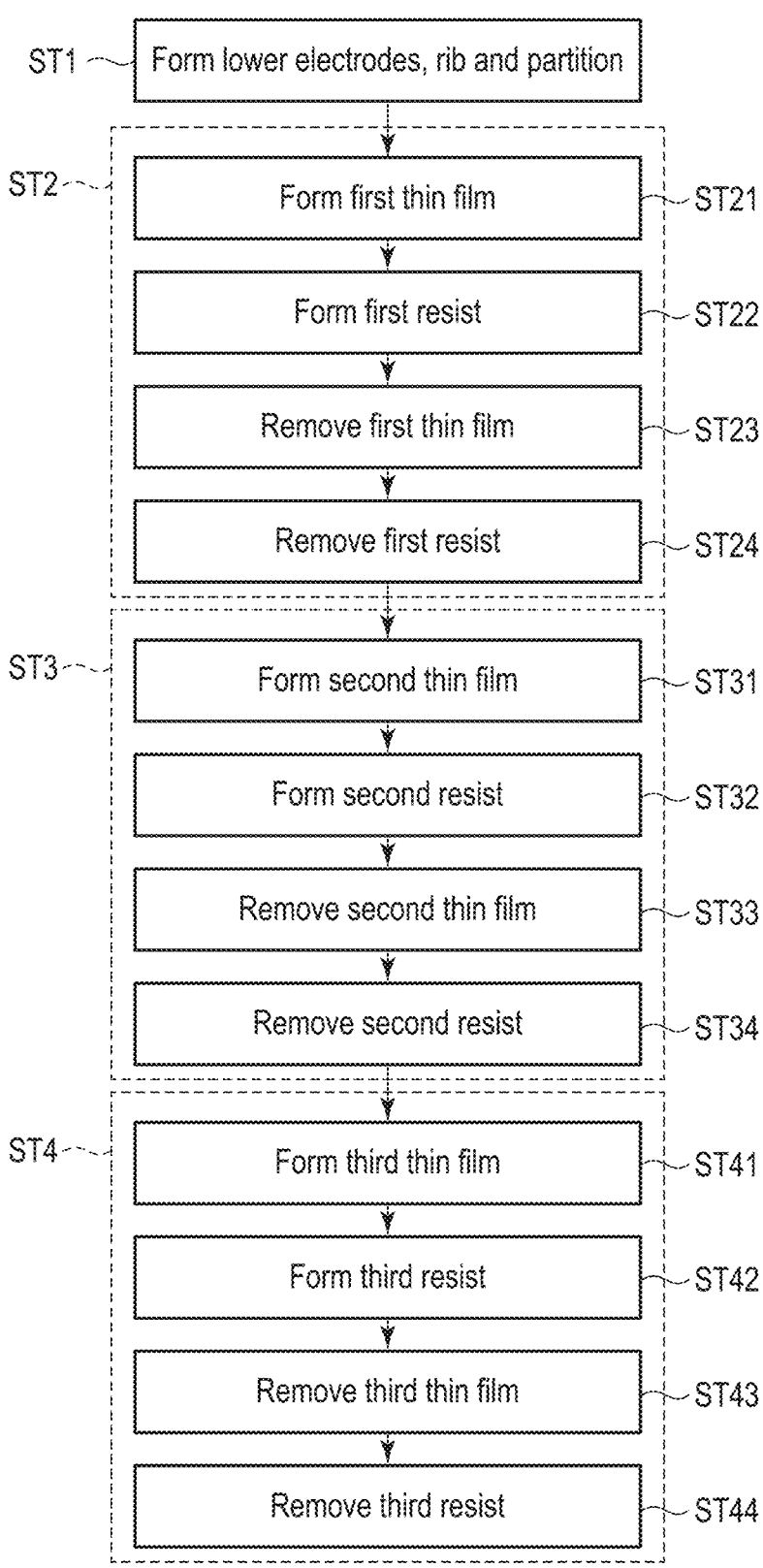
ST1 — Form lower electrodes, rib and partition
ST2
ST21 — Form first thin film
ST22 — Form first resist
ST23 — Remove first thin film
ST24 — Remove first resist
ST3
ST31 — Form second thin film
ST32 — Form second resist
ST33 — Remove second thin film
ST34 — Remove second resist
ST4
ST41 — Form third thin film
ST42 — Form third resist
ST43 — Remove third thin film
ST44 — Remove third resist
F I G. 4

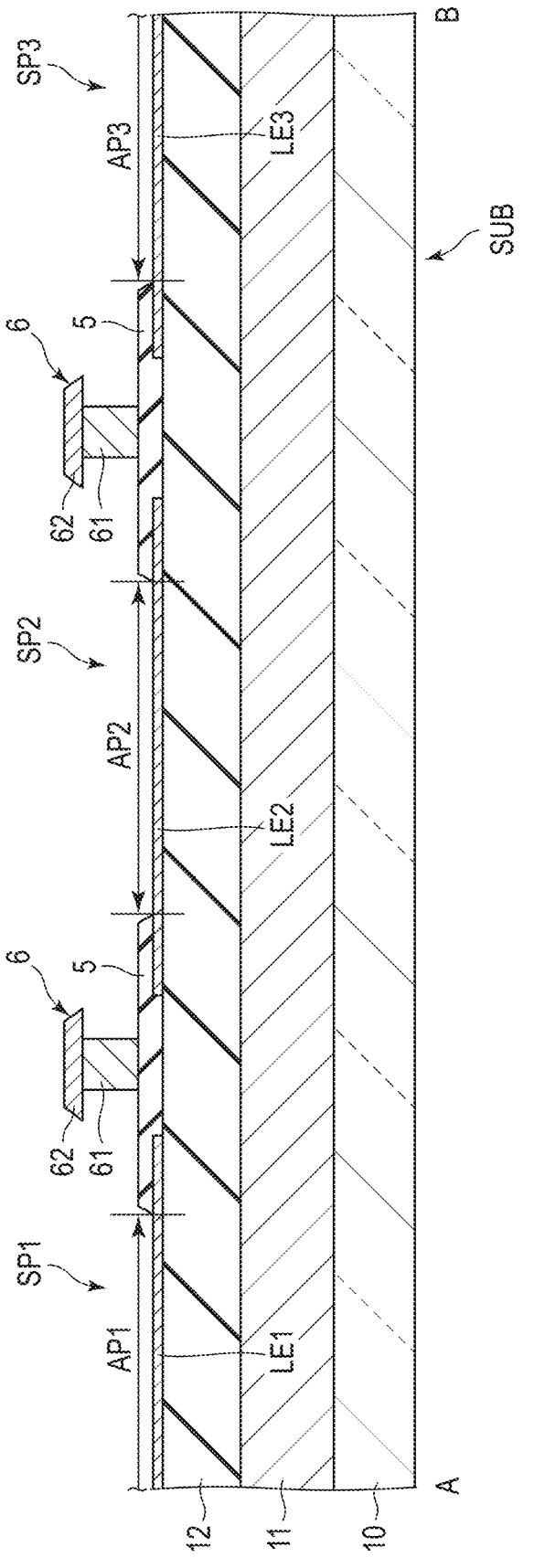
F I G. 5

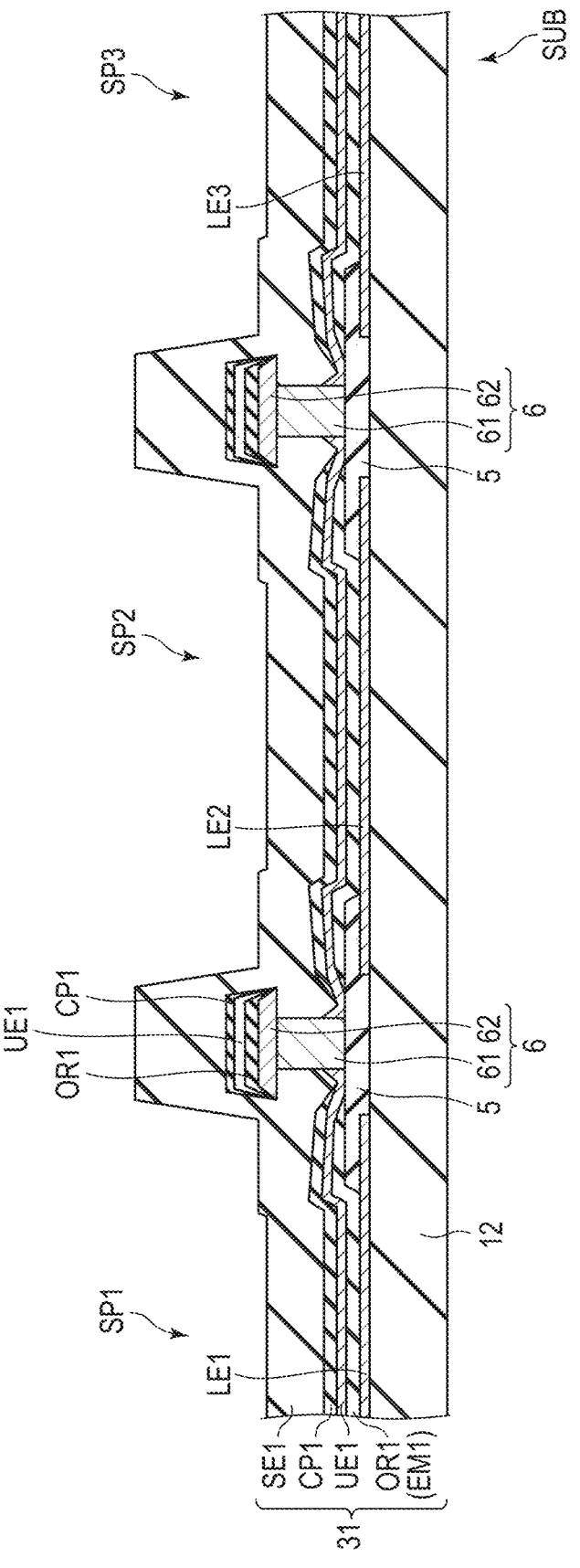
F I G. 6

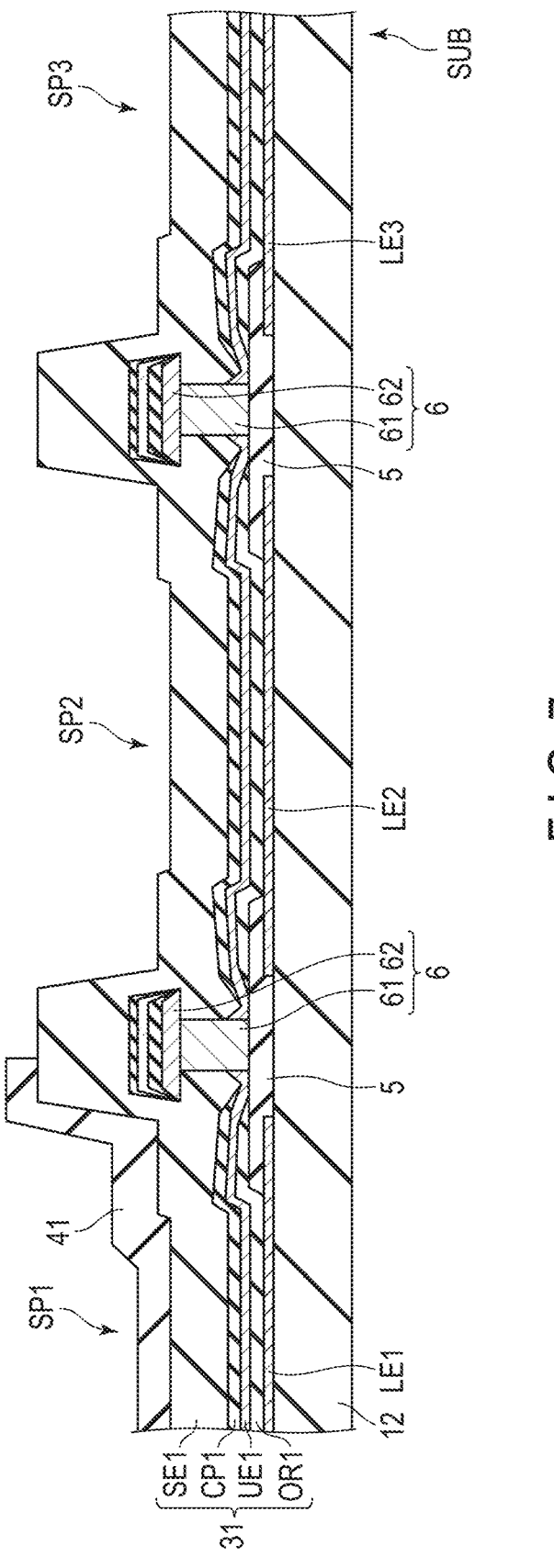
F I G. 7

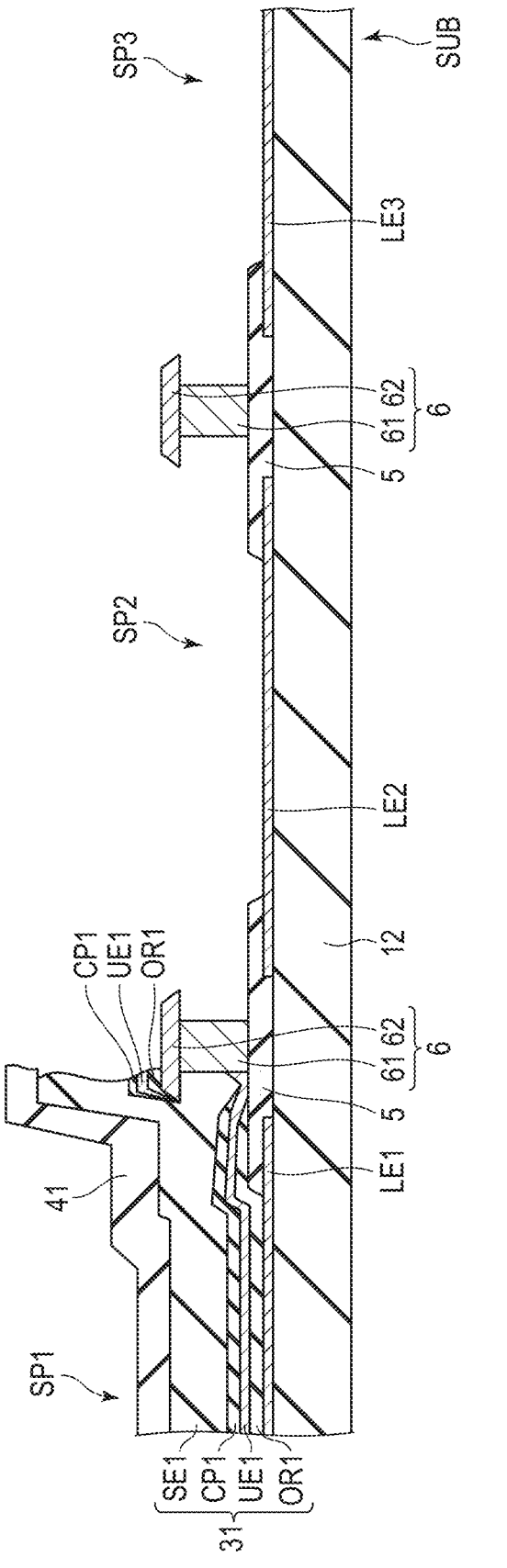
F I G. 8

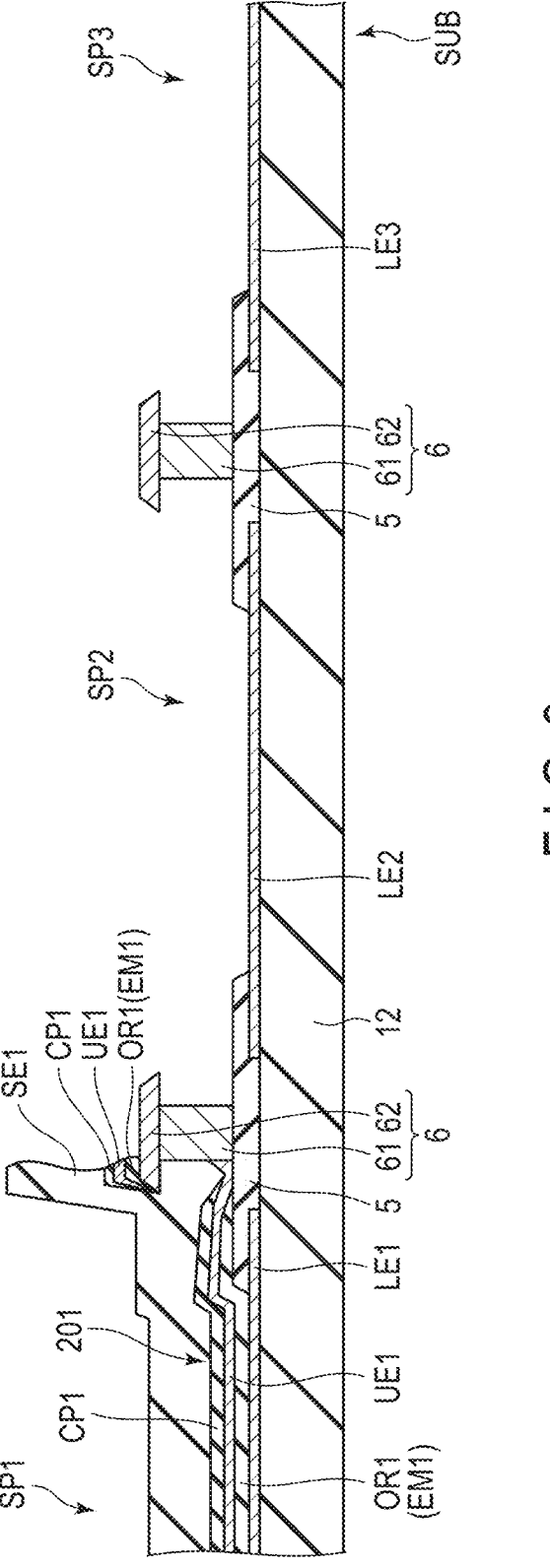
F I G. 9

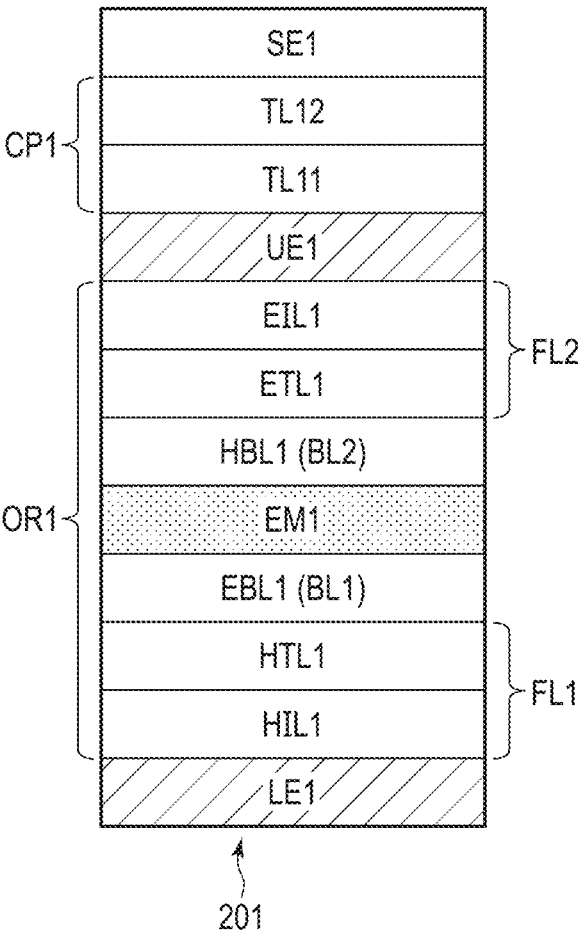
F I G. 10

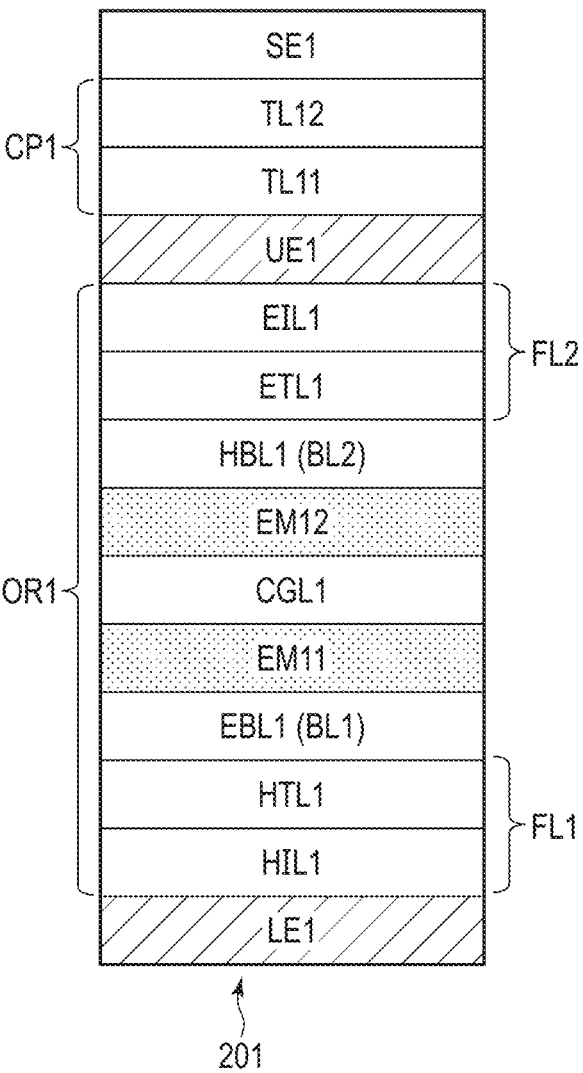
F I G. 12

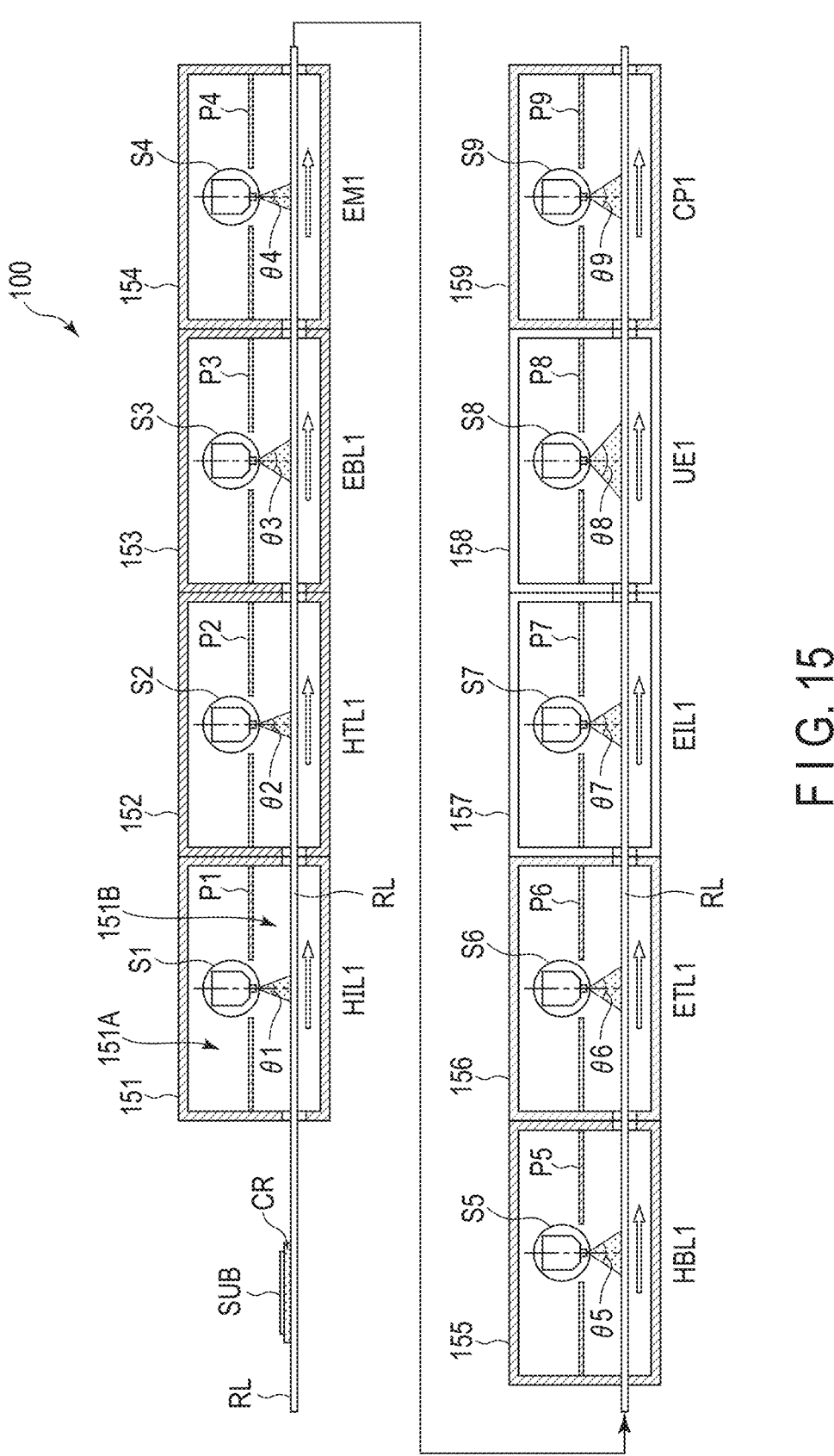
F I G. 15

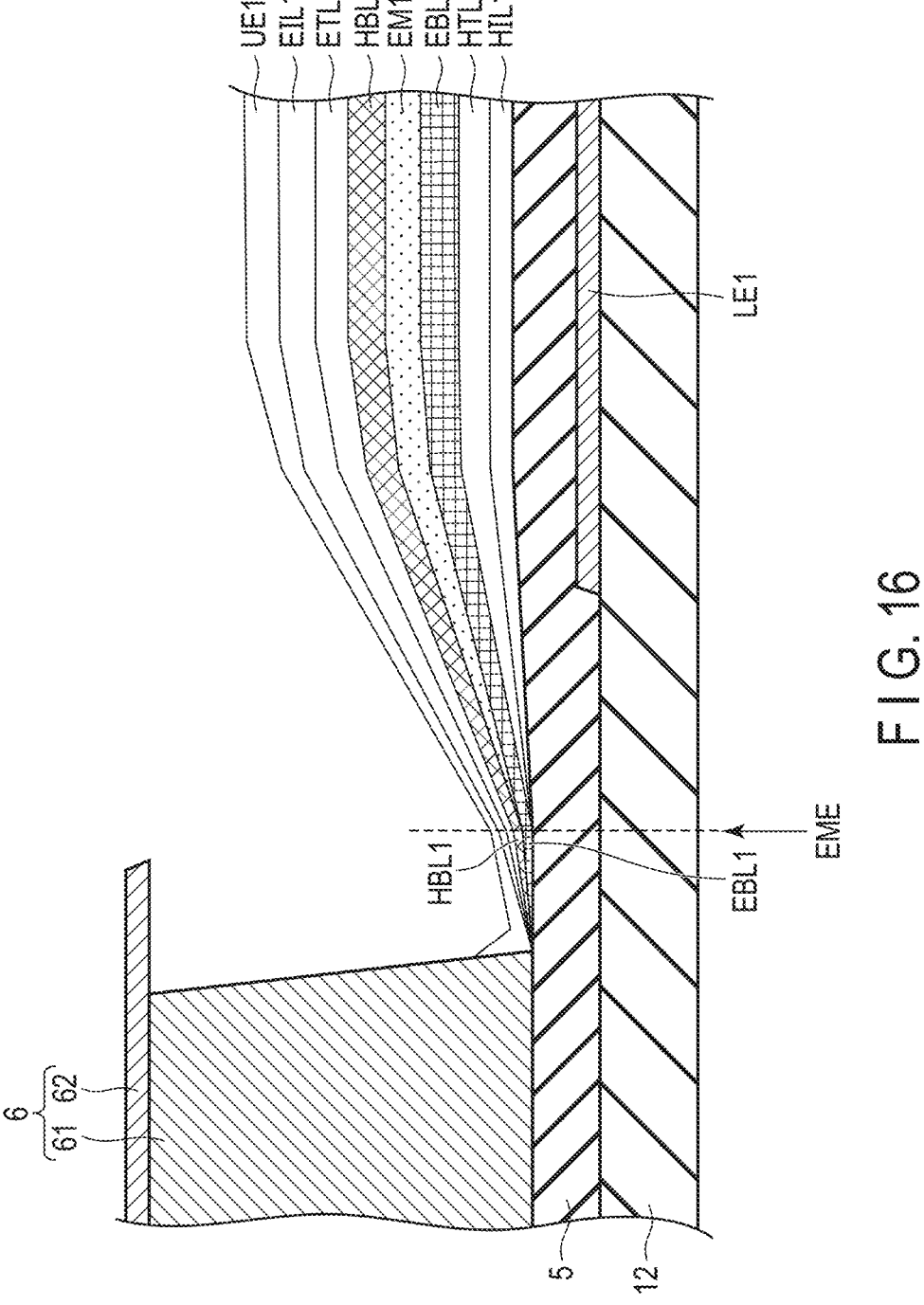
F I G. 16

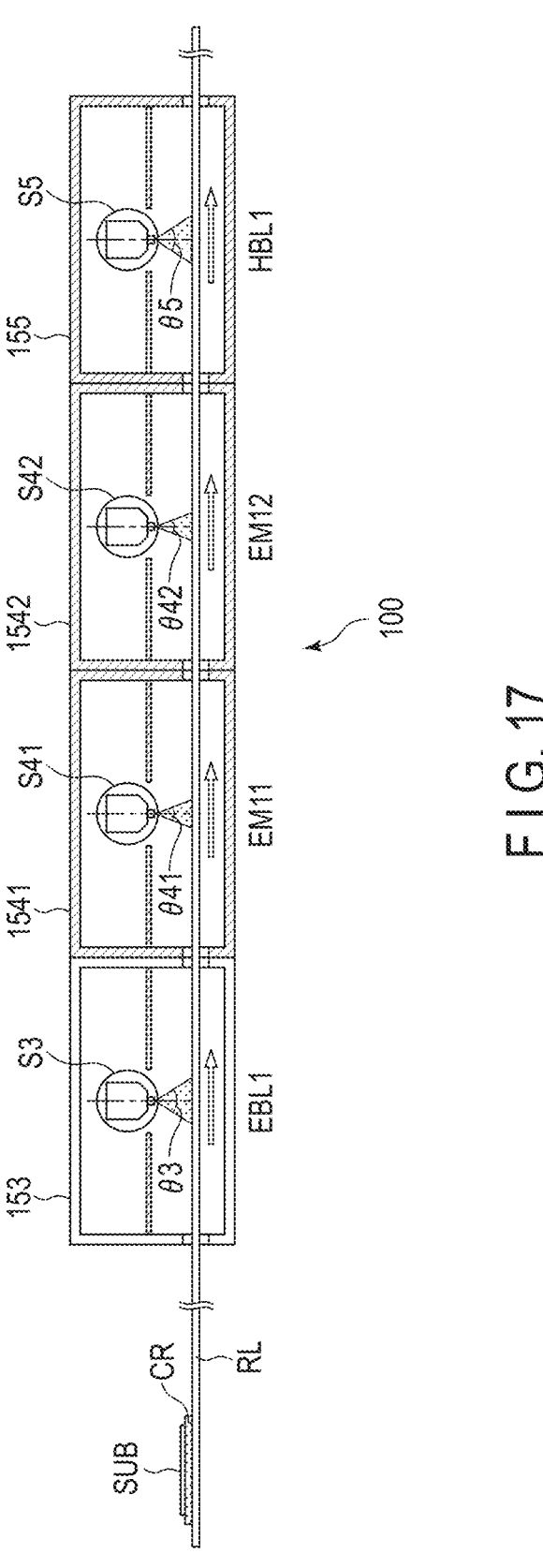
F I G. 17

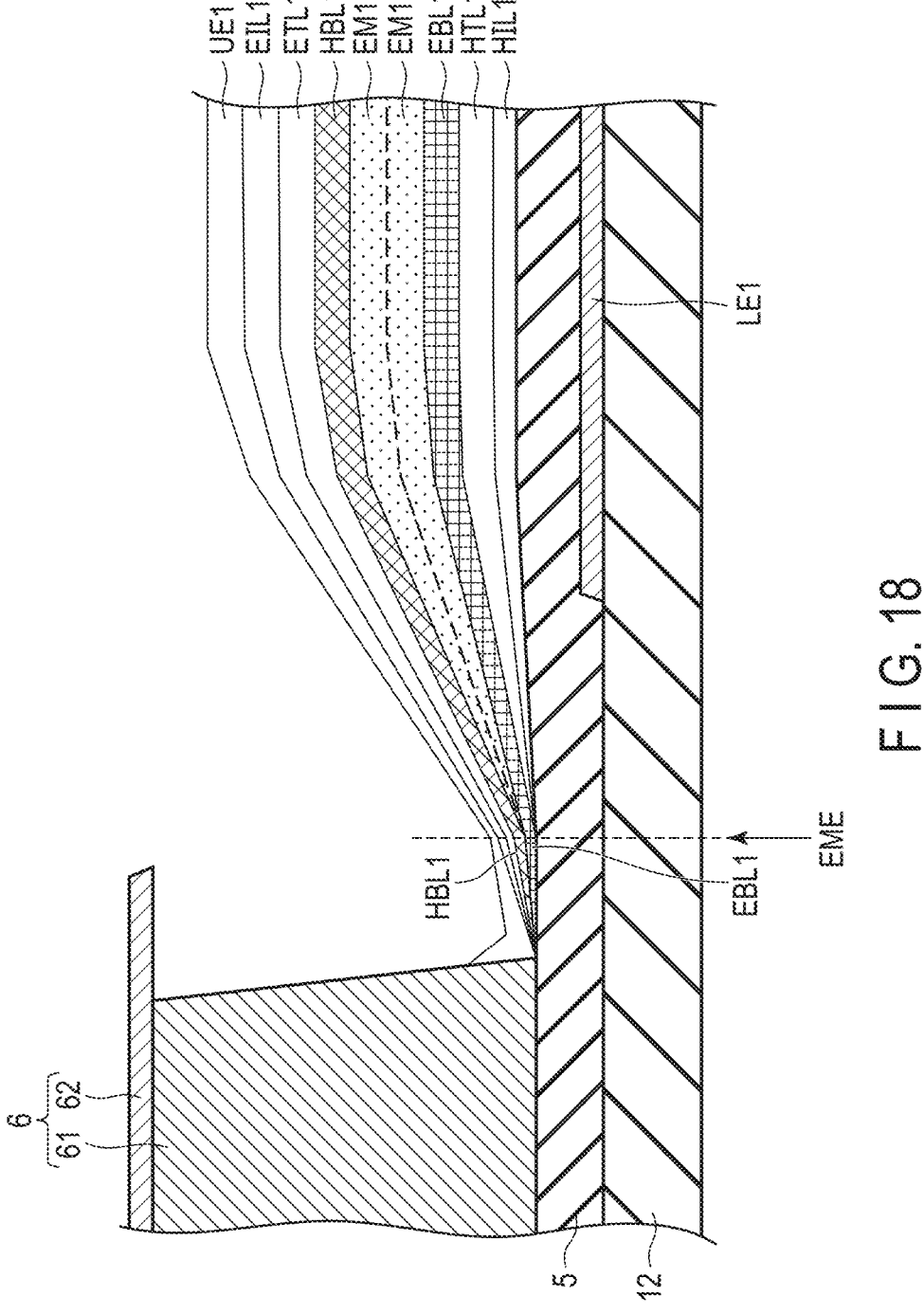
F I G. 18

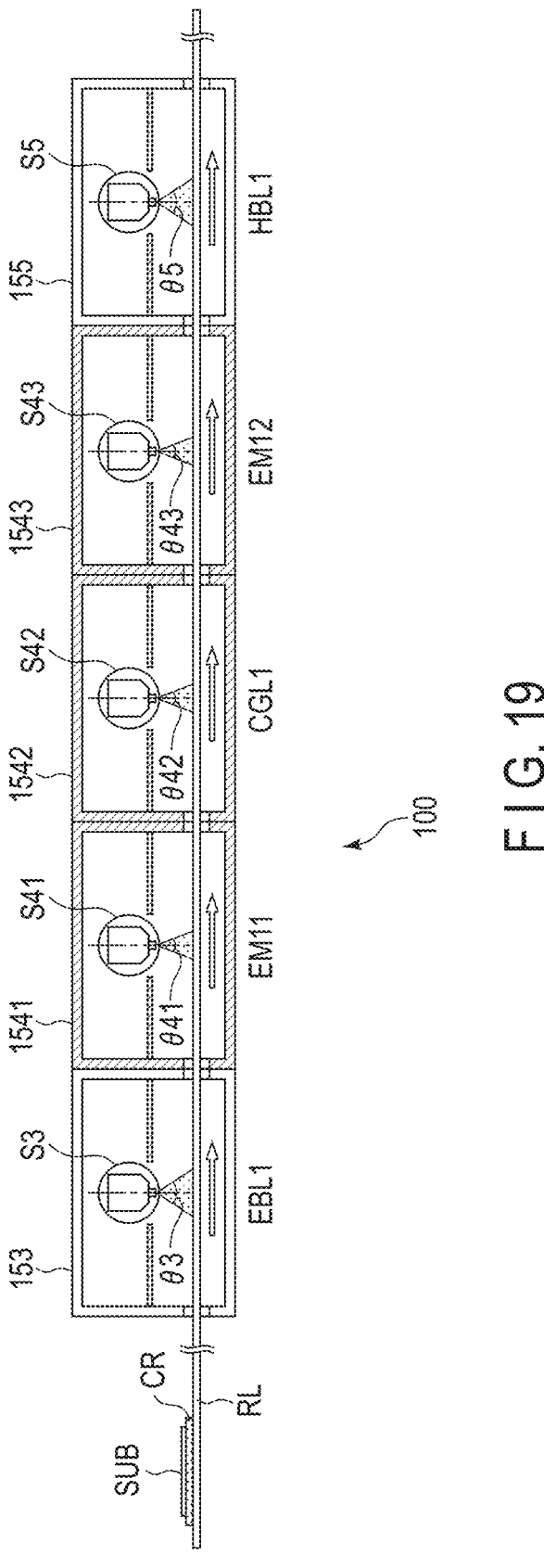
F I G. 19

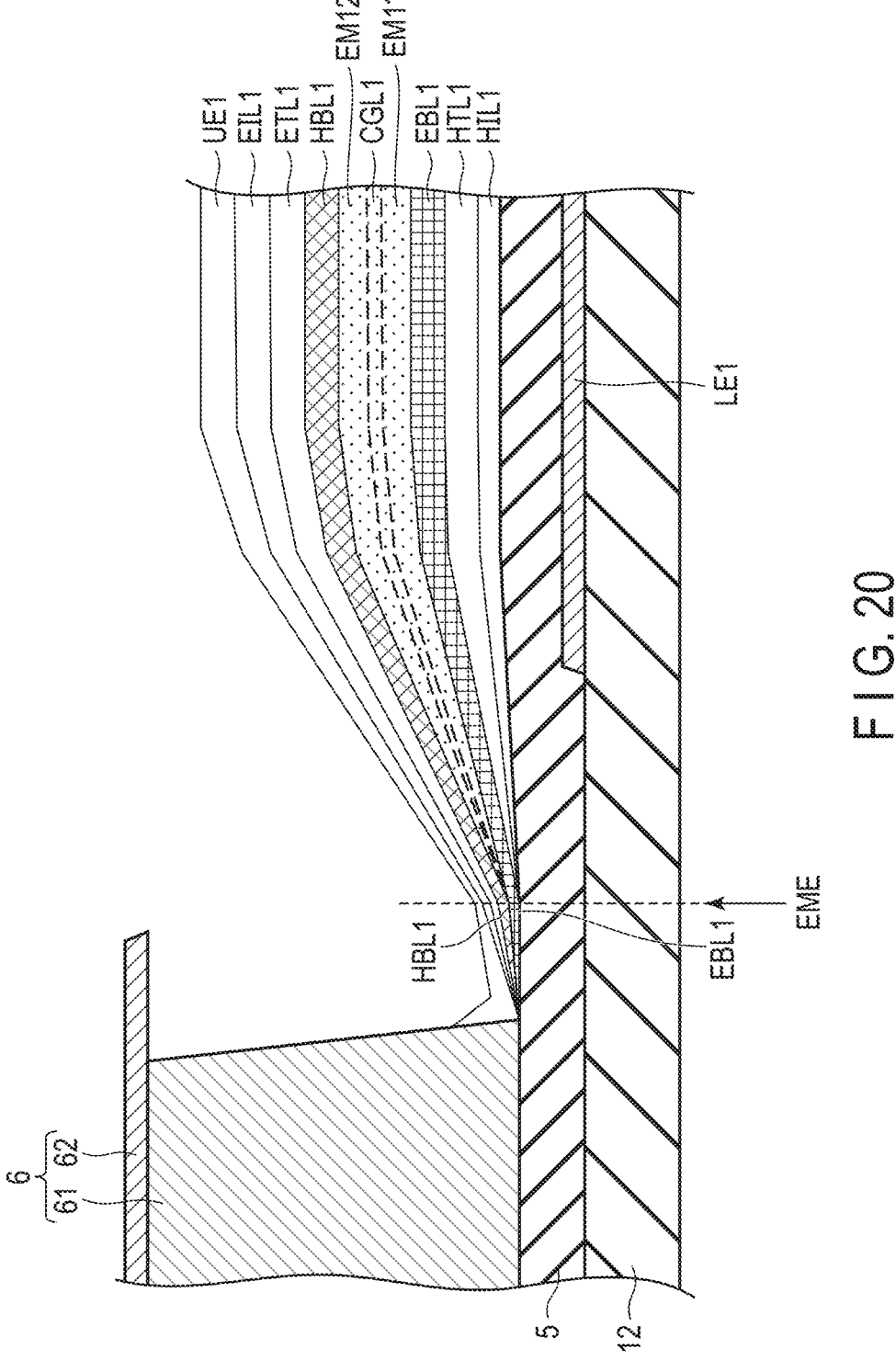
F I G. 20

1

MANUFACTURING METHOD OF DISPLAY DEVICE AND DISPLAY DEVICE

CROSS-REFERENCE TO RELATED APPLICATIONS

This application is based upon and claims the benefit of priority from Japanese Patent Application No. 2022-122532, filed Aug. 1, 2022, the entire contents of which are incorporated herein by reference.

FIELD

Embodiments described herein relate generally to a manufacturing method of a display device and a display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability has been required.

BRIEF DESCRIPTION OF THE DRAWINGS

FIG. 2 is a diagram showing an example of the layout of subpixels SP1, SP2 and SP3.

FIG. 3 is a schematic cross-sectional view of the display device DSP along the A-B line of FIG. 2.

FIG. 4 is a flow diagram for explaining an example of the manufacturing method of the display device DSP.

FIG. 5 is a diagram for explaining the manufacturing method of the display device DSP.

FIG. 6 is a diagram for explaining the manufacturing method of the display device DSP.

FIG. 7 is a diagram for explaining the manufacturing method of the display device DSP.

FIG. 8 is a diagram for explaining the manufacturing method of the display device DSP.

FIG. 9 is a diagram for explaining the manufacturing method of the display device DSP.

FIG. 10 is a diagram showing a configuration example of a display element 201.

FIG. 12 is a diagram showing another configuration example of the display element 201.

FIG. 15 is a diagram showing a configuration example of the evaporation device 100 for forming the display element 201 shown in FIG. 10.

FIG. 16 is a diagram showing the section of the layers formed by the evaporation device 100 of FIG. 15.

2

Figure 11:
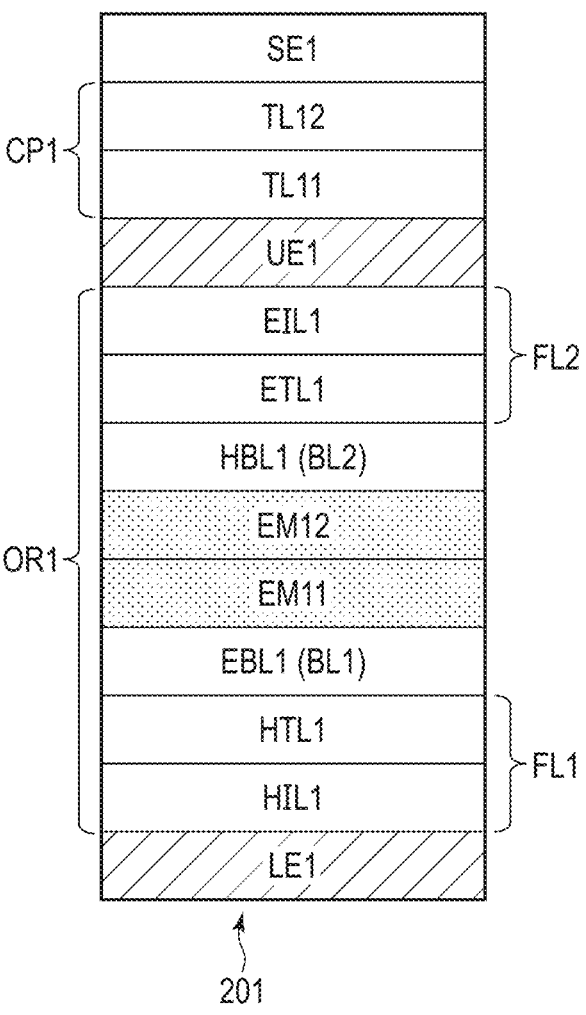
FIG. 11 is a diagram showing another configuration example of the display element 201.

FIG. 17 is a diagram showing a configuration example of the evaporation device 100 for forming the display element 201 shown in FIG. 11.

FIG. 18 is a diagram showing the section of the layers formed by the evaporation device 100 of FIG. 17.

FIG. 19 is a diagram showing a configuration example of the evaporation device 100 for forming the display element 201 shown in FIG. 12.

FIG. 20 is a diagram showing the section of the layers formed by the evaporation device 100 of FIG. 19.

DETAILED DESCRIPTION

Embodiments described herein aim to provide a manufacturing method of a display device and a display device such that the reduction in reliability can be prevented.

In general, according to one embodiment, a manufacturing method of a display device comprises preparing a processing substrate by forming a lower electrode above a substrate, forming a rib comprising an aperture overlapping the lower electrode, and forming a partition including a lower portion located on the rib and an upper portion located on the lower portion and protruding from a side surface of the lower portion, and carrying the processing substrate into an evaporation device without providing a mask, forming an organic layer on the lower electrode, forming an upper electrode on the organic layer, and carrying the processing substrate out of the evaporation device. The forming the organic layer comprises forming a first blocking layer, forming a first light emitting layer on the first blocking layer, and forming a second blocking layer on the first light emitting layer. A spread angle of a material for forming the first light emitting layer is less than a spread angle of a material for forming the first blocking layer. A spread angle of a material for forming the second blocking layer is greater than the spread angle of the material for forming the first light emitting layer.

According to another embodiment, a display device comprises a substrate, a lower electrode provided above the substrate, a rib formed of an inorganic insulating material and comprising an aperture overlapping the lower electrode, a partition comprising a lower portion which is provided on the rib and is formed of a conductive material, and an upper portion which is provided on the lower portion and protrudes from a side surface of the lower portion, an organic layer provided on the lower electrode in the aperture, an upper electrode which is provided on the organic layer and is in contact with the lower portion of the partition, a cap layer provided on the upper electrode, and a sealing layer which covers the cap layer and is in contact with the lower portion of the partition. The organic layer comprises a first light emitting layer, a first blocking layer located between the lower electrode and the first light emitting layer, and a second blocking layer located between the upper electrode and the first light emitting layer. The first light emitting layer is spaced apart from the partition. The first blocking layer and the second blocking layer are in contact with each other between the partition and the first light emitting layer.

The embodiments can provide a manufacturing method of a display device and a display device such that the reduction in reliability can be prevented.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. When various types of elements are viewed parallel to the third direction Z, the appearance is defined as a plan view. When terms indicating the positional relationships of two or more structural elements, such as "on", "above" "between" and "face", are used, the target structural elements may be directly in contact with each other or may be spaced apart from each other as a gap or another structural element is interposed between them. The positive direction of the Z-axis is referred to as an upward direction or a direction to an upper side.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

Figure 1:
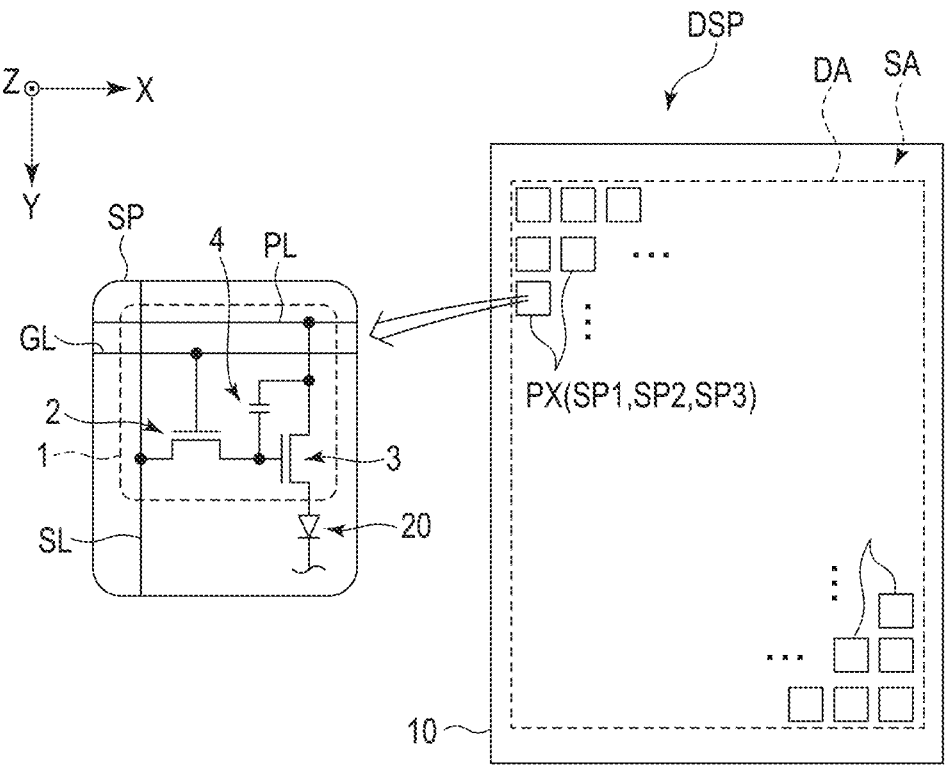
FIG. 1 is a diagram showing a configuration example of a display device DSP.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3. It should be noted that the combination of subpixels is not limited to three subpixels. The combination may consist of two subpixels or may consist of four or more subpixels by adding subpixel SP4, etc., to subpixels SP1 to SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

FIG. 2 is a diagram showing an example of the layout of subpixels SP1, SP2 and SP3.

In the example of FIG. 2, subpixels SP2 and SP3 are arranged in the second direction Y. Further, each of subpixels SP2 and SP3 is adjacent to subpixel SP1 in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are repeatedly provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively.

The partition 6 overlaps the rib 5 as seen in plan view. The partition 6 comprises a plurality of first partitions 6x extending in the first direction X and a plurality of second partitions 6y extending in the second direction Y. The first partitions 6x are provided between the apertures AP2 and AP3 which are adjacent to each other in the second direction Y and between two apertures AP1 which are adjacent to each other in the second direction Y. Each second partition 6y is provided between the apertures AP1 and AP2 which are adjacent to each other in the first direction X and between the apertures AP1 and AP3 which are adjacent to each other in the first direction X.

In the example of FIG. 2, the first partitions 6x and the second partitions 6y are connected to each other. Thus, the partition 6 is formed into a grating shape surrounding the apertures AP1, AP2 and AP3 as a whole. In other words, the partition 6 comprises apertures in subpixels SP1, SP2 and SP3 in a manner similar to that of the rib 5.

Subpixels SP1, SP2 and SP3 comprise display elements 201, 202 and 203, respectively, as the display elements 20.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. The peripheral portion of each of the lower electrodes LE1, LE2 and LE3 overlaps the rib 5. It should be noted that the outer shape of each of the lower electrodes, organic layers and upper electrodes shown in the figure does not necessarily reflect the accurate shape.

The lower electrode LE1, the upper electrode UE1 and the organic layer OR1 constitute the display element 201 of subpixel SP1. The lower electrode LE2, the upper electrode UE2 and the organic layer OR2 constitute the display element 202 of subpixel SP2. The lower electrode LE3, the upper electrode UE3 and the organic layer OR3 constitute the display element 203 of subpixel SP3.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

For example, the display element 201 of subpixel SP1 is configured to emit light in a blue wavelength range. The display element 202 of subpixel SP2 is configured to emit light in a green wavelength range. The display element 203 of subpixel SP3 is configured to emit light in a red wavelength range.

FIG. 3 is a schematic cross-sectional view of the display device DSP along the A-B line of FIG. 2.

A circuit layer 11 is provided on the substrate 10 described above. The circuit layer 11 includes various circuits and lines such as the pixel circuit 1, scanning line GL, signal line SL and power line PL shown in FIG. 1. The circuit layer 11 is covered with an insulating layer 12. The insulating layer 12 functions as a planarization film which planarizes the irregularities formed by the circuit layer 11.

The lower electrodes LE1, LE2 and LE3 are provided on the insulating layer 12. The rib 5 is provided on the insulating layer 12 and the lower electrodes LE1, LE2 and LE3. The end portions of the lower electrodes LE1, LE2 and LE3 are covered with the rib 5. In other words, the end portions of the lower electrodes LE1, LE2 and LE3 are provided between the insulating layer 12 and the rib 5. The insulating layer 12 is covered with the rib 5 between, of the lower electrodes LE1, LE2 and LE3, the lower electrodes which are adjacent to each other.

The partition 6 includes a lower portion (stem) 61 provided on the rib 5 and an upper portion (hat) 62 provided on the lower portion 61. The lower portion 61 of the partition 6 shown on the left side of the figure is located between the aperture AP1 and the aperture AP2. The lower portion 61 of the partition 6 shown on the right side of the figure is located between the aperture AP2 and the aperture AP3. The upper portion 62 has a width greater than that of the lower portion 61. By this configuration, the both end portions of the upper portion 62 protrude relative to the side surfaces of the lower portion 61. This shape of the partition 6 may be called an overhang shape. Of the upper portion 62, a portion which protrudes to the aperture AP1 relative to the lower portion 61 is referred to as a protrusion 621. A portion which protrudes to the aperture AP2 relative to the lower portion 61 is referred to as a protrusion 622. A portion which protrudes to the aperture AP3 relative to the lower portion 61 is referred to as a protrusion 623.

The organic layer OR1 is in contact with the lower electrode LE1 through the aperture AP1, covers the lower electrode LE1 and overlaps part of the rib 5. The upper electrode UE1 faces the lower electrode LE1 and is provided on the organic layer OR1. Further, the upper electrode UE1 is in contact with a side surface of the lower portion 61. The organic layer OR1 and the upper electrode UE1 are located on the lower side relative to the upper portion 62.

The organic layer OR2 is in contact with the lower electrode LE2 through the aperture AP2, covers the lower electrode LE2 and overlaps part of the rib 5. The upper electrode UE2 faces the lower electrode LE2 and is provided on the organic layer OR2. Further, the upper electrode UE2 is in contact with a side surface of the lower portion 61. The organic layer OR2 and the upper electrode UE2 are located on the lower side relative to the upper portion 62.

The organic layer OR3 is in contact with the lower electrode LE3 through the aperture AP3, covers the lower electrode LE3 and overlaps part of the rib 5. The upper electrode UE3 faces the lower electrode LE3 and is provided on the organic layer OR3. Further, the upper electrode UE3 is in contact with a side surface of the lower portion 61. The organic layer OR3 and the upper electrode UE3 are located on the lower side relative to the upper portion 62.

In the example shown in the figure, subpixels SP1, SP2 and SP3 include cap layers (optical adjustment layers) CP1, CP2 and CP3 for adjusting the optical property of the light emitted from the light emitting layers of the organic layers OR1, OR2 and OR3.

The cap layer CP1 is located in the aperture AP1, is located on the lower side relative to the upper portion 62 and is provided on the upper electrode UE1. The cap layer CP2 is located in the aperture AP2, is located on the lower side relative to the upper portion 62 and is provided on the upper electrode UE2. The cap layer CP3 is located in the aperture AP3, is located on the lower side relative to the upper portion 62 and is provided on the upper electrode UE3.

Sealing layers SE1, SE2 and SE3 are provided in subpixels SP1, SP2 and SP3, respectively.

The sealing layer SE1 is in contact with the cap layer CP1 and the lower and upper portions 61 and 62 of the partition 6 and continuously covers the members of subpixel SP1.

The sealing layer SE2 is in contact with the cap layer CP2 and the lower and upper portions 61 and 62 of the partition 6 and continuously covers the members of subpixel SP2.

The sealing layer SE3 is in contact with the cap layer CP3 and the lower and upper portions 61 and 62 of the partition 6 and continuously covers the members of subpixel SP3.

The sealing layers SE1, SE2 and SE3 are covered with a protective layer 13.

In the example shown in the figure, part of the organic layer OR1, part of the upper electrode UE1 and part of the cap layer CP1 are located between the partition 6 and the sealing layer SE1, are provided on the upper portion 62 and are spaced apart from the portions located on the lower side relative to the upper portion 62.

Part of the organic layer OR2, part of the upper electrode UE2 and part of the cap layer CP2 are located between the partition 6 and the sealing layer SE2, are provided on the upper portion 62 and are spaced apart from the portions located on the lower side relative to the upper portion 62.

Part of the organic layer OR3, part of the upper electrode UE3 and part of the cap layer CP3 are located between the partition 6 and the sealing layer SE3, are provided on the upper portion 62 and are spaced apart from the portions located on the lower side relative to the upper portion 62.

The insulating layer 12 is an organic insulating layer. The rib 5 and the sealing layers SE1, SE2 and SE3 are inorganic insulating layers.

The rib 5 is formed of silicon nitride (SiNx) as an example of inorganic insulating materials. It should be noted that the rib 5 may be formed as, as another inorganic insulating material, a single-layer body of one of silicon oxide (SiOx), silicon oxynitride (SiON) and aluminum oxide (Al₂O₃). The rib 5 may be formed as a stacked layer body of a combination consisting of at least two of a silicon nitride layer, a silicon oxide layer, a silicon oxynitride layer and an aluminum oxide layer.

The sealing layers SE1, SE2 and SE3 are formed of, for example, the same inorganic insulating material.

Each of the sealing layers SE1, SE2 and SE3 is formed of silicon nitride (SiNx) as an example of inorganic insulating materials. It should be noted that each of the sealing layers SE1, SE2 and SE3 may be formed as, as another inorganic insulating material, a single-layer body of one of silicon oxide (SiOx), silicon oxynitride (SiON) and aluminum oxide (Al₂O₃). Each of the sealing layers SE1, SE2 and SE3 may be formed as a stacked layer body of a combination consisting of at least two of a silicon nitride layer, a silicon oxide layer, a silicon oxynitride layer and an aluminum oxide layer. Thus, each of the sealing layers SE1, SE2 and SE3 may be formed of the same material as the rib 5.

The lower portion 61 of the partition 6 is formed of a conductive material and is electrically connected to the upper electrodes UE1, UE2 and UE3. Both the lower portion 61 and the upper portion 62 of the partition 6 may be formed of a conductive material.

The thickness of the rib 5 is sufficiently less than that of each of the partition 6 and the insulating layer 12. For example, the thickness of the rib 5 is greater than or equal to 200 nm but less than or equal to 400 nm.

The thickness of the lower portion 61 of the partition 6 (the thickness from the upper surface of the rib 5 to the lower surface of the upper portion 62) is greater than that of the rib 5.

The thickness of the sealing layer SE1, the thickness of the sealing layer SE2 and the thickness of the sealing layer SE3 are substantially equal to each other and are, for example, approximately 1 μm.

Each of the lower electrodes LE1, LE2 and LE3 may be formed of a transparent conductive material such as ITO or may comprise a multilayer structure of a metal material such as silver (Ag) and a transparent conductive material. Each of the upper electrodes UE1, UE2 and UE3 is formed of, for example, a metal material such as an alloy of magnesium and silver (MgAg). Each of the upper electrodes UE1, UE2 and UE3 may be formed of a transparent conductive material such as ITO.

As described later, each of the organic layers OR1, OR2 and OR3 includes a plurality of functional layers such as a hole injection layer, a hole transport layer, an electron blocking layer, a hole blocking layer, an electron transport layer and an electron injection layer. The organic layer OR1 includes a light emitting layer EM1. The organic layer OR2 includes a light emitting layer EM2. The light emitting layer EM2 is formed of a material different from that of the light emitting layer EM1. The organic layer OR3 includes a light emitting layer EM3. The light emitting layer EM3 is formed of a material different from the materials of the light emitting layers EM1 and EM2.

The material of the light emitting layer EM1, the material of the light emitting layer EM2 and the material of the light emitting layer EM3 are materials which emit light in different wavelength ranges.

For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Each of the cap layers CP1, CP2 and CP3 is formed of, for example, a multilayer body consisting of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

The protective layer 13 is formed of a multilayer body consisting of transparent thin films. For example, as the thin films, the multilayer body includes a thin film formed of an inorganic material and a thin film formed of an organic material.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer EM1 of the organic layer OR1 emits light in a blue wavelength range. When a potential difference is formed between the lower electrode LE2 and the upper electrode UE2, the light emitting layer EM2 of the organic layer OR2 emits light in a green wavelength range. When a potential difference is formed between the lower electrode LE3 and the upper electrode UE3, the light emitting layer EM3 of the organic layer OR3 emits light in a blue wavelength range.

Now, this specification explains an example of the manufacturing method of the display device DSP.

FIG. 4 is a flow diagram for explaining an example of the manufacturing method of the display device DSP.

The manufacturing method shown here roughly includes the process of preparing a processing substrate SUB comprising subpixels SP1, SP2 and SP3 (step ST1), the process of forming the display element 201 of subpixel SP1 (step ST2), the process of forming the display element 202 of subpixel SP2 (step ST3) and the process of forming the display element 203 of subpixel SP3 (step ST4).

In step ST1, first, the processing substrate SUB is prepared by forming the lower electrode LE1 of subpixel SP1, the lower electrode LE2 of subpixel SP2, the lower electrode LE3 of subpixel SP3, the rib 5 and the partition 6 above the substrate 10. As shown in FIG. 3, the circuit layer 11 and the insulating layer 12 are also formed between the substrate 10 and the lower electrodes LE1, LE2 and LE3.

In step ST2, first, a first thin film 31 including the light emitting layer EM1 is formed over subpixel SP1, subpixel SP2 and subpixel SP3 (step ST21). The first thin film 31 is a stacked layer body of the organic layer OR1, upper electrode UE1, cap layer CP1 and sealing layer SE1 shown in FIG. 3. Subsequently, a first resist 41 patterned into a predetermined shape is formed on the first thin film 31 (step ST22). Subsequently, part of the first thin film 31 is removed by etching using the first resist 41 as a mask (step ST23). At this time, for example, the first thin film 31 provided in subpixel SP2 and subpixel SP3 is removed. Subsequently, the first resist 41 is removed (step ST24). In this way, subpixel SP1 is formed. Subpixel SP1 comprises the display element 201 comprising the first thin film 31 having a predetermined shape.

In step ST3, first, a second thin film 32 including the light emitting layer EM2 is formed over subpixel SP1, subpixel SP2 and subpixel SP3 (step ST31). The second thin film 32 is a stacked layer body of the organic layer OR2, upper electrode UE2, cap layer CP2 and sealing layer SE2 shown in FIG. 3. Subsequently, a second resist 42 patterned into a predetermined shape is formed on the second thin film 32 (step ST32). Subsequently, part of the second thin film 32 is removed by etching using the second resist 42 as a mask (step ST33). At this time, for example, the second thin film 32 provided in subpixel SP1 and subpixel SP3 is removed. Subsequently, the second resist 42 is removed (step ST34). In this way, subpixel SP2 is formed. Subpixel SP2 comprises the display element 202 comprising the second thin film 32 having a predetermined shape.

In step ST4, first, a third thin film 33 including the light emitting layer EM3 is formed over subpixel SP1, subpixel SP2 and subpixel SP3 (step ST41). The third thin film 33 is a stacked layer body of the organic layer OR3, upper electrode UE3, cap layer CP3 and sealing layer SE3 shown in FIG. 3. Subsequently, a third resist 43 patterned into a predetermined shape is formed on the third thin film 33 (step ST42). Subsequently, part of the third thin film 33 is removed by etching using the third resist 43 as a mask (step ST43). At this time, for example, the third thin film 33 provided in subpixel SP1 and subpixel SP2 is removed. Subsequently, the third resist 43 is removed (step ST44). In this way, subpixel SP3 is formed. Subpixel SP3 comprises the display element 203 comprising the third thin film 33 having a predetermined shape.

It should be noted that the detailed illustrations of the second thin film 32, the second resist 42, the third thin film 33 and the third resist 43 are omitted.

Now, this specification explains step ST1 and step ST2 with reference to FIG. 5 to FIG. 9. The section shown in each of FIG. 5 to FIG. 9 corresponds to, for example, the section taken along the A-B line of FIG. 2.

First, in step ST1, as shown in FIG. 5, the processing substrate SUB is prepared. The process of preparing the processing substrate SUB includes the process of forming the circuit layer 11 on the substrate 10, the process of forming the insulating layer 12 on the circuit layer 11, the process of forming the lower electrode LE1 of subpixel SP1, the lower electrode LE2 of subpixel SP2 and the lower electrode LE3 of subpixel SP3 on the insulating layer 12, the process of forming the rib 5 comprising the apertures AP1, AP2 and AP3 overlapping the lower electrodes LE1, LE2 and LE3, respectively, and the process of forming the partition 6 including the lower portion 61 provided on the rib 5 and the upper portion 62 provided on the lower portion 61 and protruding from the side surfaces of the lower portion 61. The rib 5 is formed of, for example, silicon nitride. Of the partition 6, at least the lower portion 61 is formed of a conductive material. In each of FIG. 6 to FIG. 9, the illustrations of the substrate 10 and the circuit layer 11 lower than the insulating layer 12 are omitted.

Subsequently, in step ST21, as shown FIG. 6, the first thin film 31 is formed over subpixel SP1, subpixel SP2 and subpixel SP3. The process of forming the first thin film 31 includes, on the processing substrate SUB, the process of forming the organic layer OR1 including the light emitting layer EM1, the process of forming the upper electrode UE1 on the organic layer OR1, the process of forming the cap layer CP1 on the upper electrode UE1 and the process of forming the sealing layer SE1 on the cap layer CP1 by an inorganic insulating material. Thus, in the example shown in the figure, the first thin film 31 includes the organic layer OR1, the upper electrode UE1, the cap layer CP1 and the sealing layer SE1.

The organic layer OR1 is formed on each of the lower electrode LE1, the lower electrode LE2 and the lower electrode LE3 and is also formed on each partition 6. Of the organic layer OR1, the portion formed on each upper portion 62 is spaced apart from the portion formed on each of the lower electrodes. The various functional layers and the light emitting layer EM1 of the organic layer OR1 are formed by a vapor deposition method.

The upper electrode UE1 is formed on the organic layer OR1 immediately above each of the lower electrodes LE1, LE2 and LE3, covers the rib 5 and is in contact with the lower portion 61 of each partition 6. The upper electrode UE1 is also formed on the organic layer OR1 immediately above each upper portion 62. Of the upper electrode UE1, the portion which is formed immediately above each upper portion 62 is spaced apart from the portion which is formed immediately above each of the lower electrodes. The upper electrode UE1 is formed by a vapor deposition method.

The cap layer CP1 is formed on the upper electrode UE1 immediately above each of the lower electrode LE1, the lower electrode LE2 and the lower electrode LE3, and is also formed on the upper electrode UE1 immediately above each upper portion 62. Of the cap layer CP1, the portion which is formed immediately above each upper portion 62 is spaced apart from the portion which is formed immediately above each of the lower electrodes. The first and second transparent layers included in the cap layer CP1 are formed by a vapor deposition method.

The sealing layer SE1 is formed so as to cover the cap layer CP1 and the partition 6. In other words, the sealing layer SE1 is formed on the cap layer CP1 immediately above each of the lower electrode LE1, the lower electrode LE2 and the lower electrode LE3, and is also formed on the cap layer CP1 immediately above each upper portion 62. Moreover, the sealing layer SE1 is in contact with the lower portion 61 of the partition 6. In the sealing layer SE1, the portion which is formed immediately above each upper portion 62 is continuous with the portion which is formed immediately above each of the lower electrodes. The sealing layer SE1 is formed by a CVD method. The upper electrode UE1 is interposed between the rib 5 and the sealing layer SE1. The sealing layer SE1 is spaced apart from the rib 5.

Subsequently, in step ST22, as shown in FIG. 7, the patterned first resist 41 is formed on the sealing layer SE1. The first resist 41 covers the first thin film 31 of subpixel SP1, and the first thin film 31 is exposed from the first resist 41 in subpixels SP2 and SP3. Thus, the first resist 41 overlaps the sealing layer SE1 located immediately above the lower electrode LE1. The first resist 41 extends from subpixel SP1 to the upper side of the partition 6. On the partition 6 between subpixel SP1 and subpixel SP2, the first resist 41 is provided on the subpixel SP1 side (the left side of the figure), and the sealing layer SE1 is exposed from the first resist 41 on the subpixel SP2 side (the right side of the figure). The sealing layer SE1 is exposed from the first resist 41 in subpixel SP2 and subpixel SP3.

Subsequently, in step ST23, as shown in FIG. 8, etching is applied using the first resist 41 as a mask. By this process, the first thin film 31 exposed from the first resist 41 in subpixels SP2 and SP3 is removed, and the first thin film 31 remains in subpixel SP1.

The process of removing the first thin film 31 is, for example, as follows.

First, dry etching is performed using the first resist 41 as a mask to remove the sealing layer SE1 exposed from the first resist 41.

Subsequently, the cap layer CP1 exposed from the first resist 41 and the sealing layer SE1 is removed by performing at least one of wet etching and dry etching using the first resist 41 as a mask.

Subsequently, wet etching is performed using the first resist 41 as a mask to remove the upper electrode UE1 exposed from the first resist 41 and the cap layer CP1.

Subsequently, dry etching (asking) is performed using the first resist 41 as a mask to remove the organic layer OR1 exposed from the first resist 41 and the upper electrode UE1.

In this way, the lower electrode LE2 is exposed in subpixel SP2, and the rib 5 surrounding the lower electrode LE2 is exposed. In subpixel SP3, the lower electrode LE3 is exposed, and the rib 5 surrounding the lower electrode LE3 is exposed. On the partition 6 between subpixel SP1 and subpixel SP2, the subpixel SP2 side is exposed. Further, the partition 6 between subpixel SP2 and subpixel SP3 is exposed.

Subsequently, in step ST24, as shown in FIG. 9, the first resist 41 is removed. Thus, the sealing layer SE1 of subpixel SP1 is exposed. Through these steps ST21 to ST24, the display element 201 is formed in subpixel SP1. The display element 201 consists of the lower electrode LE1, the organic layer OR1 including the light emitting layer EM1, the upper electrode UE1 and the cap layer CP1. The display element 201 is covered with the sealing layer SE1.

A stacked layer body of the organic layer OR1 including the light emitting layer EM1, the upper electrode UE1, the cap layer CP1 and the sealing layer SE1 is formed on the partition 6 between subpixel SP1 and subpixel SP2. Of the partition 6, the portion on the subpixel SP1 side is covered with the sealing layer SE1. It should be noted that the stacked layer body on the partition 6 shown in FIG. 9 is completely eliminated in some cases.

Steps ST31 to ST34 shown in FIG. 4 are similar to steps ST21 to ST24 described above. Through these steps ST31 to ST34, the display element 202 is formed in subpixel SP2 shown in FIG. 3. The display element 202 consists of the lower electrode LE2, the organic layer OR2 including the light emitting layer EM2, the upper electrode UE2 and the cap layer CP2. The display element 202 is covered with the sealing layer SE2.

Steps ST41 to ST44 shown in FIG. 4 are also similar to steps ST21 to ST24 described above. Through these steps ST41 to ST44, the display element 203 is formed in subpixel SP3 shown in FIG. 3. The display element 203 consists of the lower electrode LE3, the organic layer OR3 including the light emitting layer EM3, the upper electrode UE3 and the cap layer CP3. The display element 203 is covered with the sealing layer SE3.

The display elements 201 to 203 described above comprise substantially the same multilayer structure. Hereinafter, this specification explains some configuration examples regarding the display element 201. Explanations of the multilayer structures of the display elements 202 and 203 are omitted.

FIG. 10 is a diagram showing a configuration example of the display element 201.

Here, this specification explains the example, assuming that the lower electrode LE1 corresponds to an anode and the upper electrode UE1 corresponds to a cathode.

The display element 201 includes the organic layer OR1 between the lower electrode LE1 and the upper electrode UE1. The organic layer OR1 includes a first functional layer FL1, a first blocking layer BL1, the light emitting layer EM1, a second blocking layer BL2 and a second functional layer FL2.

The light emitting layer EM1 is located between the first blocking layer BL1 and the second blocking layer BL2. The first functional layer FL1 is located between the lower electrode LE1 and the first blocking layer BL1 and includes a hole injection layer HIL1 and a hole transport layer HTL1. The second functional layer FL2 is located between the second blocking layer BL2 and the upper electrode UE1 and includes an electron transport layer ETL1 and an electron injection layer EIL1.

The first blocking layer BL1 is, for example, an electron blocking layer EBL1, and is a functional layer for causing the electrons supplied from the upper electrode UE1 to stay in the emitting layer EM1 and preventing the electrons from moving to the lower electrode LE1.

The second blocking layer BL2 is, for example, a hole blocking layer HBL1, and is a functional layer for causing the positive holes supplied from the lower electrode LE1 to stay in the emitting layer EM1 and preventing the positive holes from moving to the upper electrode UE1.

In the organic layer OR1, the hole injection layer HIL1, the hole transport layer HTL1, the electron blocking layer EBL1, the light emitting layer EM1, the hole blocking layer HBL1, the electron transport layer ETL1 and the electron injection layer EIL1 are stacked in this order.

The cap layer CP1 includes the first transparent layer TL11 and the second transparent layer TL12. The first transparent layer TL11 is provided on the upper electrode UE1. The first transparent layer TL11 is, for example, an organic layer formed of an organic material, and is a high refractive layer having a refractive index greater than that of the upper electrode UE1. The second transparent layer TL12 is provided on the first transparent layer TL11. The second transparent layer TL12 is, for example, an inorganic layer formed of an inorganic material such as lithium fluoride (LiF), and is a low refractive layer having a refractive index less than that of the first transparent layer TL11. The cap layer CP1 may be a stacked layer body consisting of three or more layers.

The sealing layer SE1 is provided on the second transparent layer TL12.

FIG. 11 is a diagram showing another configuration example of the display element 201.

The configuration example shown in FIG. 11 is different from the configuration example shown in FIG. 10 in respect that the organic layer OR1 further includes a light emitting layer EM11 and a light emitting layer EM12. The light emitting layer EM11 and the light emitting layer EM12 are located between the first blocking layer BL1 and the second blocking layer BL2. The light emitting layer EM11 is located between the first blocking layer BL1 and the light emitting layer EM12. The light emitting layer EM12 is located between the light emitting layer EM11 and the second blocking layer BL2.

The light emitting layer EM11 is formed of a material different from that of the light emitting layer EM12. It should be noted that the light emitting layer EM11 and the light emitting layer EM12 are formed of materials which emit substantially the same color (for example, blue). For example, the light emitting layer EM11 is formed of a material in which a relatively high luminous effect can be obtained by the supply of positive holes. The light emitting layer EM12 is formed of a material in which a relatively high luminous effect can be obtained by the supply of electrons.

FIG. 12 is a diagram showing another configuration example of the display element 201.

The configuration example shown in FIG. 12 is different from the configuration example shown in FIG. 11 in respect that the organic layer OR1 further includes a carrier generation layer CGL1. The carrier generation layer CGL1 is located between the light emitting layer EM11 and the light emitting layer EM12.

The carrier generation layer CGL1 is, for example, an n-type carrier generation layer and a p-type carrier generation layer. The n-type carrier generation layer is a functional layer which supplies electrons to the light emitting layer EM11. The p-type carrier generation layer is a functional layer which supplies positive holes to the light emitting layer EM12.

In the examples shown in FIG. 10 to FIG. 12, the light emitting layer EM1 and the light emitting layer EM11 correspond to a first light emitting layer, and the light emitting layer EM12 corresponds to a second light emitting layer. It should be noted that, in the examples shown in FIG. 10 to FIG. 12, each of the first functional layer FL1 and the second functional layer FL2 may further include a layer different from the layers shown in the figures, or at least one of the layers shown in the figures may be omitted. In the above descriptions, the configuration examples of the display element 201 are explained. The display elements 202 and 203 may comprise multilayer structures similar to the display element 201 or may comprise multilayer structures different from the display element 201.

Figure 13:
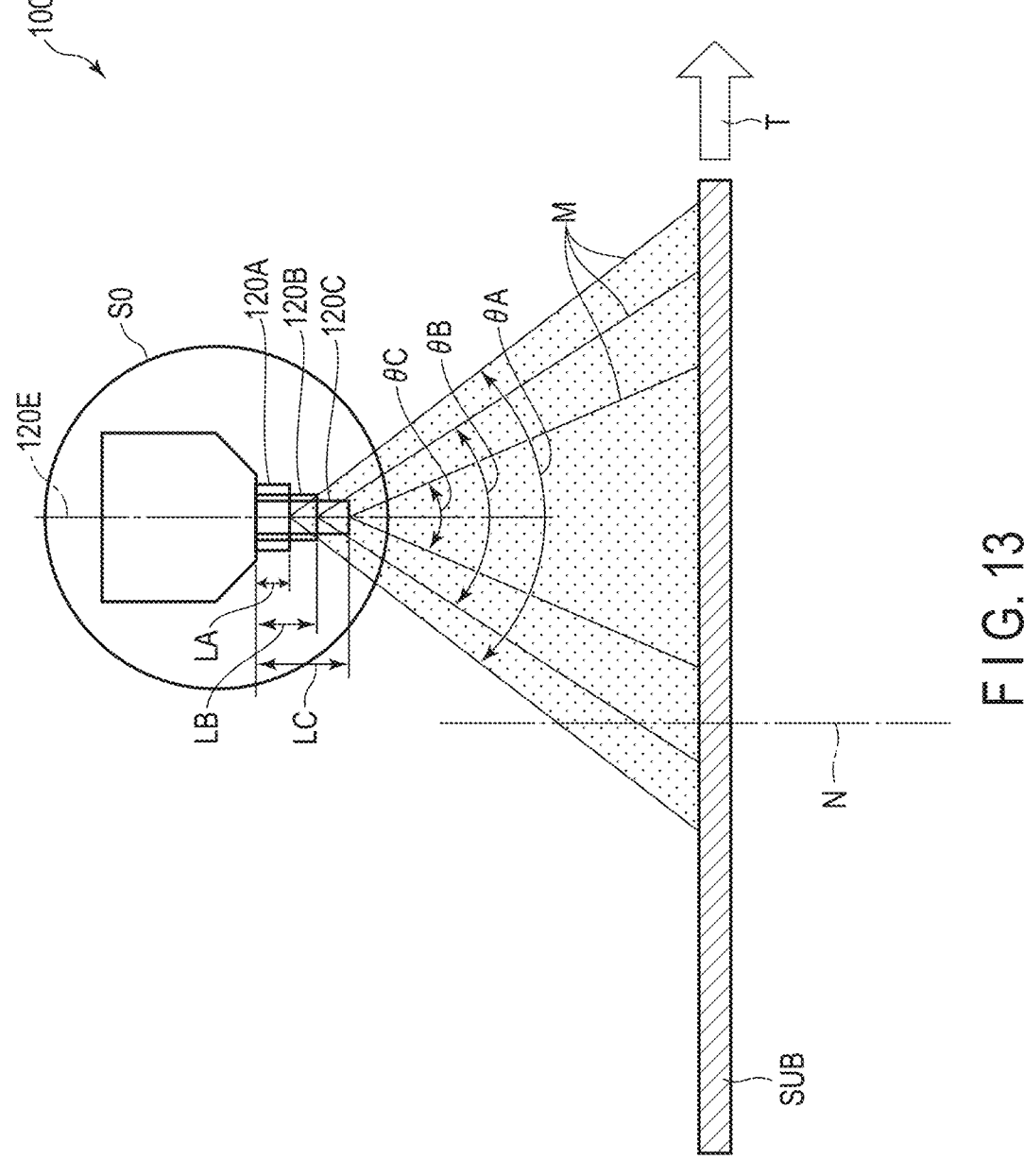
FIG. 13 is a diagram for explaining an evaporation chamber included in an evaporation device 100.

FIG. 13 is a diagram for explaining an evaporation chamber included in an evaporation device 100. The evaporation device 100 explained here can be applied to the formation of the organic layer OR1, the upper electrode UE1 and the cap layer CP1 in the process of forming the first thin film 31 explained with reference to FIG. 4 and FIG. 6.

In the evaporation chamber shown in the figure, the processing substrate SUB is conveyed in the conveyance direction T shown by the arrow in the figure. An evaporation source S0 is provided so as to face the processing substrate SUB. The evaporation source S0 is configured to apply heat to a material M and emit the vaporized material (vapor) M to the processing substrate SUB. The material M is a material for forming each layer of the organic layer OR1, a material for forming the upper electrode UE1 or a material for forming the cap layer CP1.

The evaporation source S0 comprises a nozzle 120. In the example shown in the figure, the extension direction 120E of the nozzle 120 is substantially parallel to the normal N of the processing substrate SUB. The spread angle of the material M emitted from the evaporation source S0 can be adjusted by, for example, the length of the nozzle 120 in the extension direction 120E. The spread angle of the material M which is emitted from the evaporation source S0 to the processing substrate SUB may be referred to as an evaporation angle.

Here, this specification explains the spread angle of each of the cases where a nozzle 120A with length LA, a nozzle 120B with length LB and a nozzle 120C with length LC are applied. Length LB is greater than length LA (LA<LB). Length LC is greater than length LB (LB<LC).

Spread angle $\theta$A corresponding to the case where the relatively short nozzle 120A is applied is greater than spread angle $\theta$B corresponding to the case where the nozzle 120B longer than the nozzle 120A is applied ($\theta$A>$\theta$B). Spread angle $\theta$B corresponding to the case where the nozzle 120B is applied is greater than spread angle $\theta$C corresponding to the case where the nozzle 120C longer than the nozzle 120B is applied ($\theta$B>$\theta$C).

In this manner, as the nozzle is longer, the restriction by the nozzle on the emitted material M becomes stronger, thereby enhancing the property in which the material M goes straight, and thus, the spread angle becomes less. To the contrary, as the nozzle is shorter, the restriction by the nozzle on the emitted material M becomes more difficult, thereby enhancing the property in which the material M spreads, and thus, the spread angle becomes greater. In this manner, the spread angle of the material M which is emitted from the evaporation source S0 to the processing substrate SUB can be freely controlled by adjusting length L of the nozzle 120.

In FIG. 13, for convenience sake, this specification explains the example to which three types of nozzles 120A, 120B and 120C are applied. It should be noted that two types of nozzles with different lengths can be applied, or four or more types of nozzles with different lengths can be applied.

Figure 14:
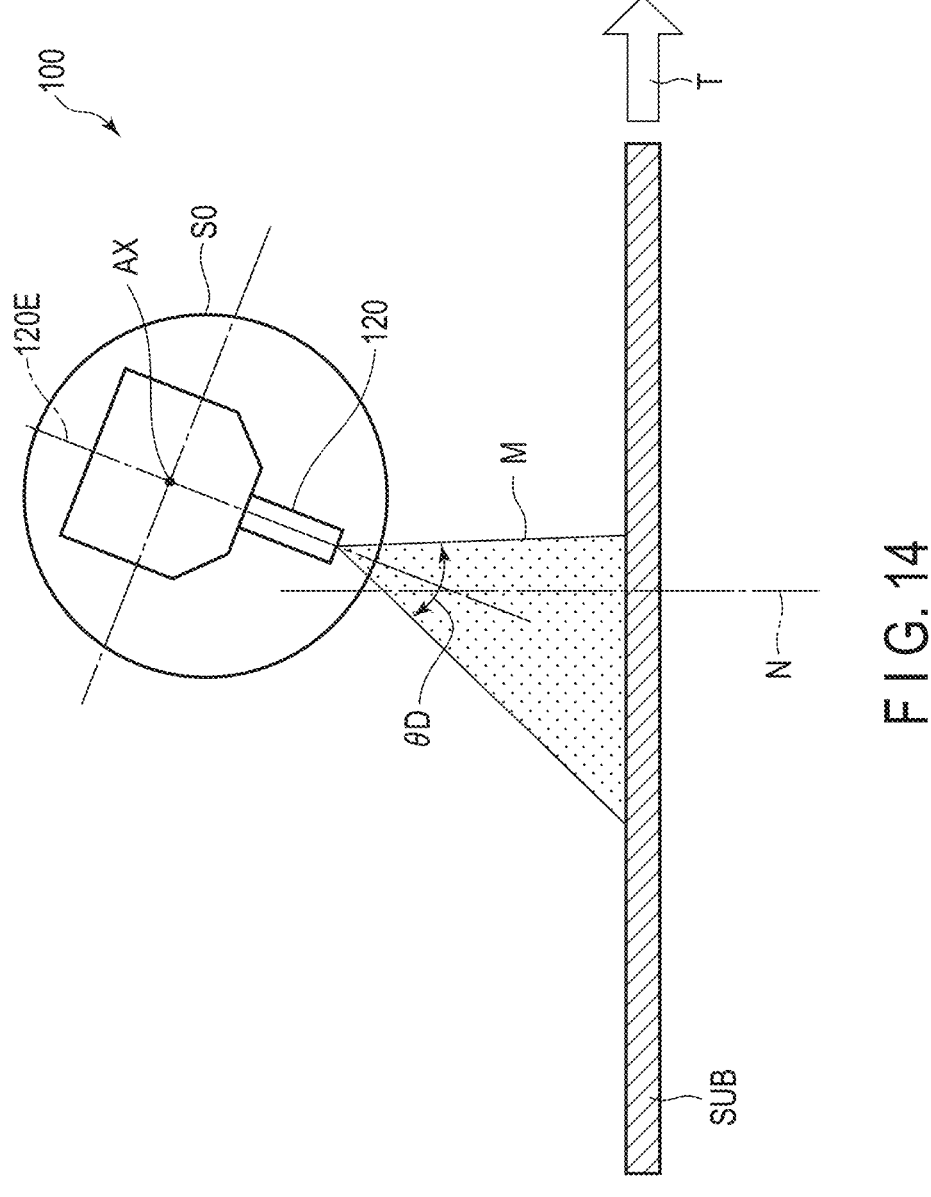
FIG. 14 is another cross-sectional view of an evaporation source S0.

FIG. 14 is another cross-sectional view of the evaporation source S0.

The evaporation source S0 is configured to rotate about a rotation axis AX. The evaporation source S0 extends along the rotation axis AX.

In the example shown in the figure, the extension direction 120E of the nozzle 120 inclines with respect to the normal N of the processing substrate SUB. Spread angle $\theta$D of the material M which is emitted from the evaporation source S0 to the processing substrate SUB is substantially constant regardless of the inclination of the evaporation source S0.

As shown in FIG. 13 and FIG. 14, the area on which the material M is deposited can be freely set by adjusting the spread angle and the inclination of the evaporation source S0 described above.

FIG. 15 is a diagram showing a configuration example of the evaporation device 100 for forming the display element 201 shown in FIG. 10.

The evaporation device 100 comprises a plurality of evaporation chambers 151 to 159. These evaporation chambers 151 to 159 are connected to each other.

The evaporation chamber 151 is configured to form the hole injection layer HIL1.

The evaporation chamber 152 is configured to form the hole transport layer HTL1.

The evaporation chamber 153 is configured to form the electron blocking layer EBL1.

The evaporation chamber 154 is configured to form the light emitting layer EM1.

The evaporation chamber 155 is configured to form the hole blocking layer HBL1.

The evaporation chamber 156 is configured to form the electron transport layer ETL1.

The evaporation chamber 157 is configured to form the electron injection layer EIL1.

The evaporation chamber 158 is configured to form the upper electrode UE1.

The evaporation chamber 159 is configured to form the cap layer CP1. Here, the figure shows only the evaporation chamber 159 for forming the cap layer CP1. However, when the cap layer CP1 is a stacked layer body consisting of the first transparent layer TL11 and the second transparent layer TL12 as described above, an evaporation chamber for forming the first transparent layer TL11 and an evaporation chamber for forming the second transparent layer TL12 are connected to each other.

A conveyance rail RL extends over the evaporation chamber 151 to the evaporation chamber 159. A carrier CR on which the processing substrate SUB is loaded is conveyed at substantially a constant speed along the conveyance rail RL.

Each of the evaporation chambers 151 to 159 comprises an evaporation source and a partition plate.

Specifically, the evaporation chamber 151 comprises an evaporation source S1 and a partition plate P1. The partition plate P1 partitions the evaporation chamber 151 into a first space 151A and a second space 151B. The evaporation source S1 is accommodated in the first space 151A. The second space 151B is a space in which the processing substrate SUB is conveyed together with the carrier CR. In the second space 151B, the conveyance rail RL is provided. The evaporation source S1 is configured to emit a material for forming the hole injection layer HIL1 at spread angle θ1 in the second space 151B.

The evaporation chamber 152 comprises an evaporation source S2 and a partition plate P2. The evaporation source S2 is configured to emit a material for forming the hole transport layer HTL1 at spread angle θ2. Spread angle θ2 is set so as to be substantially equal to spread angle θ1.

The evaporation chamber 153 comprises an evaporation source S3 and a partition plate P3. The evaporation source S3 is configured to emit a material for forming the electron blocking layer EBL1 at spread angle θ3. Spread angle θ3 is set so as to be greater than spread angles θ1 and θ2 (θ1<θ3, θ2<θ3).

The evaporation chamber 154 comprises an evaporation source S4 and a partition plate P4. The evaporation source S4 is configured to emit a material for forming the light emitting layer EM1 at spread angle θ4. Spread angle θ4 is set so as to be less than spread angle θ3 (θ4<θ3).

The evaporation chamber 155 comprises an evaporation source S5 and a partition plate P5. The evaporation source S5 is configured to emit a material for forming the hole blocking layer HBL1 at spread angle θ5. Spread angle θ5 is set so as to be greater than spread angle θ4 (θ4<θ5).

The evaporation chamber 156 comprises an evaporation source S6 and a partition plate P6. The evaporation source S6 is configured to emit a material for forming the electron transport layer ETL1 at spread angle θ6. Spread angle θ6 is set so as to be substantially equal to spread angle θ5.

The evaporation chamber 157 comprises an evaporation source S7 and a partition plate P7. The evaporation source S7 is configured to emit a material for forming the electron injection layer EIL1 at spread angle θ7. Spread angle θ7 is set so as to be substantially equal to spread angle θ6. Spread angles θ6 and θ7 are set so as to be greater than spread angle θ4 (θ4<θ6, θ4<θ7).

The evaporation chamber 158 comprises an evaporation source S8 and a partition plate P8. The evaporation source S8 is configured to emit a material for forming the upper electrode UE1 at spread angle θ8. Spread angle θ8 is set so as to be greater than spread angle θ7 (θ7<θ8).

The evaporation chamber 159 comprises an evaporation source S9 and a partition plate P9. The evaporation source S9 is configured to emit a material for forming the cap layer CP1 at spread angle θ9.

Regarding each of the evaporation sources S1 to S9, the spread angle of the material is controlled by adjusting the length of the nozzle in a manner similar to that of the evaporation source S0 explained with reference to FIG. 13. Each of the evaporation sources S1 to S9 may incline with respect to the normal of the processing substrate SUB depending on the need in a manner similar to that of the evaporation source S0 explained with reference to FIG. 14.

Each of the evaporation sources S1 to S9 is configured to apply heat to the material, vaporize the material and continuously emit the material during the operation of the evaporation device 100. The materials emitted from the evaporation sources S1 to S9 are different from each other. The material emitted from each of the evaporation sources S1 to S9 is deposited on the processing substrate SUB which is conveyed together with the carrier CR.

Now, this specification explains the process of forming the organic layer OR1, the upper electrode UE1 and the cap layer CP1 of the display element 201 shown in FIG. 10.

First, after the processing substrate SUB explained with reference to FIG. 5 is prepared, the processing substrate SUB is carried in the evaporation device 100 without providing a fine mask.

Subsequently, when the processing substrate SUB passes through the evaporation chamber 151, the hole injection layer HIL1 is formed on the lower electrode LE1.

Subsequently, when the processing substrate SUB passes through the evaporation chamber 152, the hole transport layer HTL1 is formed on the hole injection layer HIL1.

Subsequently, when the processing substrate SUB passes through the evaporation chamber 153, the electron blocking layer EBL1 is formed as the first blocking layer BL1 on the hole transport layer HTL1. Since the electron blocking layer EBL1 is formed of a material which is emitted at spread angle θ3 as described above, the electron blocking layer EBL1 is formed over a range which is broader than the hole injection layer HIL1 and the hole transport layer HTL1.

Subsequently, when the processing substrate SUB passes through the evaporation chamber 154, the light emitting layer EM1 is formed on the electron blocking layer EBL1. Since the light emitting layer EM1 is formed of a material which is emitted at spread angle θ4 as described above, the light emitting layer EM1 is formed over a range which is narrower than the electron blocking layer EBL1.

Subsequently, when the processing substrate SUB passes through the evaporation chamber 155, the hole blocking layer HBL1 is formed on the light emitting layer EM1. Since the hole blocking layer HBL1 is formed of a material which is emitted at spread angle θ5 as described above, the hole blocking layer HBL1 is formed over a range which is broader than the light emitting layer EM1.

Subsequently, when the processing substrate SUB passes through the evaporation chamber 156, the electron transport layer ETL1 is formed on the hole blocking layer HBL1.

Subsequently, when the processing substrate SUB passes through the evaporation chamber 157, the electron injection layer EIL1 is formed on the electron transport layer ETL1.

Subsequently, when the processing substrate SUB passes through the evaporation chamber 158, the upper electrode UE1 is formed on the electron injection layer EIL1. Since the upper electrode UE1 is formed of a material which is emitted at spread angle θ8 as described above, the upper electrode UE1 is formed over a range which is broader than the electron injection layer EIL1, etc.

Subsequently, when the processing substrate SUB passes through the evaporation chamber 159, the cap layer CP1 is formed on the upper electrode UE1.

Subsequently, the processing substrate SUB is carried out of the evaporation device 100.

In the processing substrate SUB carried out of the evaporation device 100, as explained with reference to FIG. 6, the organic layer OR1 formed on the partition 6 is spaced apart from the organic layer OR1 formed on the lower electrode LE1 in the aperture AP1. The upper electrode UE1 formed on the partition 6 is spaced apart from the upper electrode UE1 formed immediately above the lower electrode LE1. The cap layer CP1 formed on the partition 6 is spaced apart from the cap layer CP1 formed immediately above the lower electrode LE1.

FIG. 16 is a diagram showing the section of the layers formed by the evaporation device 100 of FIG. 15.

Here, the figure shows an enlarged view of the section of the layers located on the rib 5 between the partition 6 and the aperture.

The hole injection layer HIL1 is provided on the rib 5, and is provided on the lower electrode LE1 in the aperture AP1 as shown in FIG. 3. The hole transport layer HTL1 is provided on the hole injection layer HIL1. The hole injection layer HIL1 and the hole transport layer HTL1 are spaced apart from the partition 6.

The electron blocking layer EBL1 covers the hole injection layer HIL1 and the hole transport layer HTL1 and is in contact with the rib 5 between the partition 6 and the hole injection layer HIL1 and between the partition 6 and the hole transport layer HTL1.

The light emitting layer EM1 is provided on the electron blocking layer EBL1 and is spaced apart from the partition 6. An end portion EME of the light emitting layer EM1 is located on the electron blocking layer EBL1. The light emitting layer EM1 is not in contact with the hole injection layer HIL1 or the hole transport layer HTL1.

The hole blocking layer HBL1 covers the light emitting layer EM1 and is in contact with the electron blocking layer EBL1 between the end portion EME of the light emitting layer EM1 and the partition 6. In other words, the light emitting layer EM1 is sealed with the electron blocking layer EBL1 and the hole blocking layer HBL1.

The electron transport layer ETL1 is provided on the hole blocking layer HBL1. The electron injection layer EIL1 is provided on the electron transport layer ETL1. The upper electrode UE1 is provided on the electron injection layer EIL1 and is in contact with the lower portion 61 of the partition 6.

In this configuration example, the electron blocking layer EBL1 and the hole blocking layer HBL1 are formed over a broader range than the light emitting layer EM1. In addition, the contact between the light emitting layer EM1 and the hole injection layer HIL1, the contact between the light emitting layer EM1 and the hole transport layer HTL1, the contact between the light emitting layer EM1 and the electron injection layer EIL1 and the contact between the light emitting layer EM1 and the electron transport layer ETL1 are avoided.

Thus, positive holes and electrons can stay in the light emitting layer EM1 as intended. The degradation of the light emitting property is prevented, and further, an undesired current leak is prevented. In this manner, the reduction in reliability can be prevented.

In particular, when layers are formed in respective evaporation chambers, the positions of the end portions of the formed layers may vary from each other because of the difference in the materials to be evaporated, the difference in the evaporation conditions, etc. For example, when the light emitting layer EM1 is in contact with the hole injection layer HIL1 or the hole transport layer HTL1, the electrons which should stay in the light emitting layer EM1 may flow to the hole injection layer HIL1 or the hole transport layer HTL1, and thus, a failure may occur.

Such a problem can be solved by sealing the light emitting layer EM1 with the electron blocking layer EBL1 and the hole blocking layer HBL1 as described above. In this manner, the reduction in reliability can be prevented.

FIG. 17 is a diagram showing a configuration example of the evaporation device 100 for forming the display element 201 shown in FIG. 11.

The configuration example shown in FIG. 17 is different from the configuration example shown in FIG. 15 in respect that the evaporation device 100 comprises evaporation chambers 1541 and 1542 between the evaporation chamber 153 and the evaporation chamber 155. In FIG. 17, the illustrations of the evaporation chambers 151, 152 and 156 to 159 shown in FIG. 15 are omitted. The evaporation chamber 153, the evaporation chamber 1541, the evaporation chamber 1542 and the evaporation chamber 155 are connected to each other.

The evaporation chamber 1541 comprises an evaporation source S41. The evaporation source S41 is configured to emit a material for forming the light emitting layer EM11 at spread angle $\theta 41$. Spread angle $\theta 41$ is set so as to be less than spread angles $\theta 3$ ($\theta 41 < \theta 3$).

The evaporation chamber 1542 comprises an evaporation source S42. The evaporation source S42 is configured to emit a material for forming the light emitting layer EM12 at spread angle $\theta 42$. Spread angle $\theta 42$ is set so as to be less than spread angle $\theta 3$ ($\theta 42 < \theta 3$). The material for forming the light emitting layer EM12 is different from the material for forming the light emitting layer EM11.

In the evaporation chamber 155, the evaporation source S5 is configured to emit a material for forming the hole blocking layer HBL1 at spread angle $\theta 5$. Spread angle $\theta 5$ is set so as to be greater than spread angles $\theta 41$ and $\theta 42$ ($\theta 41 < \theta 5$, $\theta 42 < \theta 5$).

In this evaporation device 100, the processing substrate SUB in which the hole transport layer HTL1 is formed is carried in the evaporation chamber 153. When the processing substrate SUB passes through the evaporation chamber 153, the electron blocking layer EBL1 is formed as the first blocking layer BL1 on the hole transport layer HTL1. Since the electron blocking layer EBL1 is formed of a material which is emitted at spread angle $\theta 3$ as described above, the electron blocking layer EBL1 is formed over a range which is broader than the hole injection layer HIL1 and the hole transport layer HTL1.

Subsequently, when the processing substrate SUB passes through the evaporation chamber 1541, the light emitting layer EM11 is formed on the electron blocking layer EBL1. Since the light emitting layer EM11 is formed of a material which is emitted at spread angle $\theta 41$ as described above, the light emitting layer EM11 is formed over a range which is narrower than the electron blocking layer EBL1.

Subsequently, when the processing substrate SUB passes through the evaporation chamber 1542, the light emitting layer EM12 is formed on the light emitting layer EM11. Since the light emitting layer EM12 is formed of a material which is emitted at spread angle $\theta 42$ as described above, the light emitting layer EM12 is formed over a range which is narrower than the electron blocking layer EBL1.

Subsequently, when the processing substrate SUB passes through the evaporation chamber 155, the hole blocking layer HBL1 is formed on the light emitting layer EM12. Since the hole blocking layer HBL1 is formed of a material which is emitted at spread angle θ5 as described above, the hole blocking layer HBL1 is formed over a range which is broader than the light emitting layers EM11 and EM12.

FIG. 18 is a diagram showing the section of the layers formed by the evaporation device 100 of FIG. 17.

Here, the figure shows an enlarged view of the section of the layers located on the rib 5 between the partition 6 and the aperture.

The hole injection layer HIL1 and the hole transport layer HTL1 are spaced apart from the partition 6. The electron blocking layer EBL1 covers the hole injection layer HIL1 and the hole transport layer HTL1 and is in contact with the rib 5 between the partition 6 and the hole injection layer HIL1 and between the partition 6 and the hole transport layer HTL1.

The light emitting layer EM11 is provided on the electron blocking layer EBL1 and is spaced apart from the partition 6. The light emitting layer EM12 is provided on the light emitting layer EM11 and is spaced apart from the partition 6. The end portions EME of the light emitting layers EM11 and EM12 are located on the electron blocking layer EBL1. The light emitting layer EM11 or EM12 is not in contact with the hole injection layer HIL1 or the hole transport layer HTL1.

The hole blocking layer HBL1 covers the light emitting layers EM11 and EM12 and is in contact with the electron blocking layer EBL1 between the end portions EME and the partition 6. In other words, the light emitting layers EM11 and EM12 are sealed with the electron blocking layer EBL1 and the hole blocking layer HBL1.

In this configuration example, similarly, the electron blocking layer EBL1 and the hole blocking layer HBL1 are formed over a broader range than the light emitting layers EM11 and EM12. For this reason, effects similar to those of the above configuration example are obtained.

FIG. 19 is a diagram showing a configuration example of the evaporation device 100 for forming the display element 201 shown in FIG. 12.

The configuration example shown in FIG. 19 is different from the configuration example shown in FIG. 15 in respect that the evaporation device 100 comprises evaporation chambers 1541 to 1543 between the evaporation chamber 153 and the evaporation chamber 155. In FIG. 19, the illustrations of the evaporation chambers 151, 152 and 156 to 159 shown in FIG. 15 are omitted. The evaporation chamber 153, the evaporation chamber 1541, the evaporation chamber 1542, the evaporation chamber 1543 and the evaporation chamber 155 are connected to each other.

The evaporation chamber 1541 comprises an evaporation source S41. The evaporation source S41 is configured to emit a material for forming the light emitting layer EM11 at spread angle θ41. Spread angle θ41 is set so as to be less than spread angle θ3 (θ41<θ3).

The evaporation chamber 1542 comprises an evaporation source S42. The evaporation source S42 is configured to emit a material for forming the carrier generation layer CGL1 at spread angle θ42. Spread angle θ42 is set so as to be less than spread angle θ3 (θ42<θ3).

The evaporation chamber 1543 comprises an evaporation source S43. The evaporation source S43 is configured to emit a material for forming the light emitting layer EM12 at spread angle θ43. Spread angle θ43 is set so as to be less than spread angle θ3 (θ43<θ3). The material for forming the light emitting layer EM12 is different from the material for forming the light emitting layer EM11.

In the evaporation chamber 155, the evaporation source S5 is configured to emit a material for forming the hole blocking layer HBL1 at spread angle θ5. Spread angle θ5 is set so as to be greater than spread angles θ41 to θ43 (θ41<θ5, θ42<θ5, θ43<θ5).

In this evaporation device 100, the processing substrate SUB in which the hole transport layer HTL1 is formed is carried in the evaporation chamber 153. When the processing substrate SUB passes through the evaporation chamber 153, the electron blocking layer EBL1 is formed as the first blocking layer BL1 on the hole transport layer HTL1. Since the electron blocking layer EBL1 is formed of a material which is emitted at spread angle θ3 as described above, the electron blocking layer EBL1 is formed over a range which is broader than the hole injection layer HIL1 and the hole transport layer HTL1.

Subsequently, when the processing substrate SUB passes through the evaporation chamber 1541, the light emitting layer EM11 is formed on the electron blocking layer EBL1. Since the light emitting layer EM11 is formed of a material which is emitted at spread angle θ41 as described above, the light emitting layer EM11 is formed over a range which is narrower than the electron blocking layer EBL1.

Subsequently, when the processing substrate SUB passes through the evaporation chamber 1542, the carrier generation layer CGL1 is formed on the light emitting layer EM11. Since the carrier generation layer CGL1 is formed of a material which is emitted at spread angle θ42 as described above, the carrier generation layer CGL1 is formed over a range which is narrower than the electron blocking layer EBL1.

Subsequently, when the processing substrate SUB passes through the evaporation chamber 1543, the light emitting layer EM12 is formed on the carrier generation layer CGL1. Since the light emitting layer EM12 is formed of a material which is emitted at spread angle θ43 as described above, the light emitting layer EM12 is formed over a range which is narrower than the electron blocking layer EBL1.

Subsequently, when the processing substrate SUB passes through the evaporation chamber 155, the hole blocking layer HBL1 is formed on the light emitting layer EM12. Since the hole blocking layer HBL1 is formed of a material which is emitted at spread angle θ5 as described above, the hole blocking layer HBL1 is formed over a range which is broader than the light emitting layer EM11, the carrier generation layer CGL1 and the light emitting layer EM12.

FIG. 20 is a diagram showing the section of the layers formed by the evaporation device 100 of FIG. 19.

Here, the figure shows an enlarged view of the section of the layers located on the rib 5 between the partition 6 and the aperture.

The hole injection layer HIL1 and the hole transport layer HTL1 are spaced apart from the partition 6. The electron blocking layer EBL1 covers the hole injection layer HIL1 and the hole transport layer HTL1 and is in contact with the rib 5 between the partition 6 and the hole injection layer HIL1 and between the partition 6 and the hole transport layer HTL1.

The light emitting layer EM11 is provided on the electron blocking layer EBL1 and is spaced apart from the partition 6. The carrier generation layer CGL1 is provided on the light emitting layer EM11 and is spaced apart from the partition 6. The light emitting layer EM12 is provided on the carrier generation layer CGL1 and is spaced apart from the partition 6. The end portions EME of the light emitting layer EM11, the carrier generation layer CGL1 and the light emitting layer EM12 are located on the electron blocking layer EBL1. None of the light emitting layer EM11, the carrier generation layer CGL1 and the light emitting layer EM12 is in contact with the hole injection layer HIL1 or the hole transport layer HTL1.

The hole blocking layer HBL1 covers the light emitting layer EM11, the carrier generation layer CGL1 and the light emitting layer EM12 and is in contact with the electron blocking layer EBL1 between the end portions EME and the partition 6. In other words, the light emitting layer EM11, the carrier generation layer CGL1 and the light emitting layer EM12 are sealed with the electron blocking layer EBL1 and the hole blocking layer HBL1.

In this configuration example, similarly, the electron blocking layer EBL1 and the hole blocking layer HBL1 are formed over a broader range than the light emitting layer EM11, the carrier generation layer CGL1 and the light emitting layer EM12. For this reason, effects similar to those of the above configuration examples are obtained.

As explained above, the embodiments can provide a manufacturing method of a display device and a display device such that the reduction in reliability can be prevented.

All of the manufacturing methods of a display device and display devices that can be implemented by a person of ordinary skill in the art through arbitrary design changes to the manufacturing method and display device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A manufacturing method of a display device, comprising:

preparing a processing substrate by forming a lower electrode above a substrate, forming a rib comprising an aperture overlapping the lower electrode, and forming a partition including a lower portion located on the rib and an upper portion located on the lower portion and protruding from a side surface of the lower portion; and carrying the processing substrate into an evaporation device without providing a mask, forming an organic layer on the lower electrode, forming an upper electrode on the organic layer, and carrying the processing substrate out of the evaporation device, wherein the forming the organic layer comprises:

forming a first blocking layer, forming a first light emitting layer on the first blocking layer, and forming a second blocking layer on the first light emitting layer, a spread angle of a material for forming the first light emitting layer is less than a spread angle of a material for forming the first blocking layer, and a spread angle of a material for forming the second blocking layer is greater than the spread angle of the material for forming the first light emitting layer.

2. The manufacturing method of claim 1, wherein the first blocking layer is an electron blocking layer, the forming the organic layer further comprises, before forming the first blocking layer, forming a hole injection layer on the lower electrode, and forming a hole transport layer on the hole injection layer, and the spread angle of the material for forming the first blocking layer is greater than a spread angle of a material for forming each of the hole injection layer and the hole transport layer.

3. The manufacturing method of claim 1, wherein the second blocking layer is a hole blocking layer, the forming the organic layer further comprises, after forming the second blocking layer, forming an electron transport layer on the second blocking layer, and forming an electron injection layer on the electron transport layer, and a spread angle of a material for forming each of the electron transport layer and the electron injection layer is greater than the spread angle of the material for forming the first light emitting layer.

4. The manufacturing method of claim 3, wherein a spread angle of a material for forming the upper electrode is greater than the spread angle of the material for forming the electron injection layer, and the upper electrode is in contact with the lower portion of the partition.

5. The manufacturing method of claim 1, wherein the forming the organic layer further comprises forming a second light emitting layer on the first light emitting layer after forming the first light emitting layer and before forming the second blocking layer, the second light emitting layer is formed of a material which is different from the first light emitting layer and which emits light exhibiting a color similar to the first light emitting layer, a spread angle of a material for forming the second light emitting layer is less than the spread angle of the material for forming the first blocking layer, and the spread angle of the material for forming the second blocking layer is greater than the spread angle of the material for forming the second light emitting layer.

6. The manufacturing method of claim 1, wherein the forming the organic layer further comprises, after forming the first light emitting layer and before forming the second blocking layer, forming a carrier generation layer on the first light emitting layer, and forming a second light emitting layer on the carrier generation layer, the second light emitting layer is formed of a material which is different from the first light emitting layer and which emits light exhibiting a color similar to the first light emitting layer, a spread angle of a material for forming each of the carrier generation layer and the second light emitting layer is less than the spread angle of the material for forming the first blocking layer, and the spread angle of the material for forming the second blocking layer is greater than the spread angle of the material for forming each of the carrier generation layer and the second light emitting layer.

7. The manufacturing method of claim 1, further comprising forming a transparent cap layer after forming the upper electrode.

8. The manufacturing method of claim 7, wherein in the processing substrate carried out of the evaporation device, the organic layer, the upper electrode and the cap layer formed on the partition are spaced apart from the organic layer, the upper electrode and the cap layer formed on the lower electrode in the aperture.

9. The manufacturing method of claim 8, further comprising forming a sealing layer by an inorganic insulating material after forming the cap layer, wherein the sealing layer covers the cap layer on the partition, covers the cap layer immediately above the lower electrode, and is in contact with the lower portion of the partition.

10. The manufacturing method of claim 9, further comprising:

forming a patterned resist on the sealing layer after forming the sealing layer;

removing the sealing layer exposed from the resist;

removing the cap layer exposed from the resist;

removing the upper electrode exposed from the resist; and removing the organic layer exposed from the resist.

11. A display device comprising:

a substrate;

a lower electrode provided above the substrate;

a rib formed of an inorganic insulating material and comprising an aperture overlapping the lower electrode;

a partition comprising a lower portion which is provided on the rib and is formed of a conductive material, and an upper portion which is provided on the lower portion and protrudes from a side surface of the lower portion;

an organic layer provided on the lower electrode in the aperture;

an upper electrode which is provided on the organic layer and is in contact with the lower portion of the partition;

a cap layer provided on the upper electrode; and a sealing layer which covers the cap layer and is in contact with the lower portion of the partition, wherein the organic layer comprises a first light emitting layer, a first blocking layer located between the lower electrode and the first light emitting layer, and a second blocking layer located between the upper electrode and the first light emitting layer, the first light emitting layer is spaced apart from the partition, and the first blocking layer and the second blocking layer are in contact with each other between the partition and the first light emitting layer.

12. The display device of claim 11, wherein the first blocking layer is an electron blocking layer, the organic layer further comprises a hole injection layer provided on the lower electrode, and a hole transport layer provided on the hole injection layer, the hole injection layer and the hole transport layer are spaced apart from the partition, and the first blocking layer is in contact with the rib between the partition and the hole injection layer and between the partition and the hole transport layer.

13. The display device of claim 12, wherein the second blocking layer is a hole blocking layer, the organic layer further comprises an electron transport layer provided on the second blocking layer, and an electron injection layer provided on the electron transport layer, and the upper electrode is provided on the electron injection layer.

14. The display device of claim 11, wherein the organic layer further comprises a second light emitting layer provided on the first light emitting layer, the second light emitting layer is formed of a material which is different from the first light emitting layer and which emits light exhibiting a color similar to the first light emitting layer, the second light emitting layer is spaced apart from the partition, and the first blocking layer and the second blocking layer are in contact with each other between the partition and the second light emitting layer.

15. The display device of claim 11, wherein the organic layer further comprises a carrier generation layer provided on the first light emitting layer, and a second light emitting layer provided on the carrier generation layer, the second light emitting layer is formed of a material which is different from the first light emitting layer and which emits light exhibiting a color similar to the first light emitting layer, the carrier generation layer and the second light emitting layer are spaced apart from the partition, and the first blocking layer and the second blocking layer are in contact with each other between the partition and the carrier generation layer and between the partition and the second light emitting layer.

* * * * *